(12) United States Patent
Marakhtanov et al.

(10) Patent No.: US 9,984,859 B2
(45) Date of Patent: May 29, 2018

(54) IMPEDANCE MATCHING CIRCUIT FOR OPERATION WITH A KILOHERTZ RF GENERATOR AND A MEGAHERTZ RF GENERATOR TO CONTROL PLASMA PROCESSES

(71) Applicant: Lam Research Corporation, Fremont, CA (US)

(72) Inventors: Alexei Marakhtanov, Albany, NY (US); Felix Kozakevich, Sunnyvale, CA (US); John Patrick Holland, San Jose, CA (US); Brett Jacobs, San Leandro, CA (US)

(73) Assignee: Lam Research Corporation, Fremont, CA (US)

(*) Notice: Subject to any disclaimer, the term of this patent is extended or adjusted under 35 U.S.C. 154(b) by 0 days. days.

(21) Appl. No.: 15/439,838

(22) Filed: Feb. 22, 2017

(65) Prior Publication Data

US 2017/0162368 A1    Jun. 8, 2017

Related U.S. Application Data

(63) Continuation of application No. 14/636,007, filed on Mar. 2, 2015, now Pat. No. 9,595,424.

(51) Int. Cl.
*H01L 37/02* (2006.01)
*H01J 37/32* (2006.01)
*H01F 38/14* (2006.01)
*H03H 7/38* (2006.01)
*H03H 7/40* (2006.01)

(52) U.S. Cl.
CPC ........ *H01J 37/32183* (2013.01); *H01F 38/14* (2013.01); *H01J 37/3255* (2013.01); *H01J 37/32128* (2013.01); *H01J 37/32568* (2013.01); *H03H 7/38* (2013.01); *H03H 7/40* (2013.01); *H01F 2038/146* (2013.01)

(58) Field of Classification Search
CPC ........... H01J 37/32183; H01J 37/32357; H01J 37/3244; H01J 2237/3321; H01J 2237/335
USPC ............. 315/111.21, 111.91, 111.01, 111.71; 156/345

See application file for complete search history.

(56) References Cited

U.S. PATENT DOCUMENTS 5,339,039 A * 8/1994 Carlile .............. H01J 37/32082
204/192.33
5,994,662 A * 11/1999 Murugesh ............. H01J 37/321
156/345.33

(Continued)

*Primary Examiner* — Douglas W Owens
*Assistant Examiner* — Syed M Kaiser
(74) *Attorney, Agent, or Firm* — Martine Penilla Group, LLP

(57) ABSTRACT

An impedance matching circuit (IMC) is described. The impedance matching circuit includes a first circuit. The first circuit has an input coupled to a kilohertz (kHz) radio frequency (RF) generator. The IMC includes a second circuit. The second circuit has an input coupled to a low frequency megahertz (MHz) RF generator. The IMC includes a third circuit. The third circuit has an input coupled to a high frequency MHz RF generator. The IMC includes an output of the first, second, and third circuits coupled to an input of an RF transmission line. The first circuit and the second circuit provide isolation between a kHz RF signal sent through the first circuit and a low frequency MHz RF signal sent through the second circuit.

18 Claims, 17 Drawing Sheets

(56) References Cited

U.S. PATENT DOCUMENTS

| | | | | |
|---|---|---|---|---|
| 8,168,957 B2* | 5/2012 | Keller | ...................... | H01J 27/16 156/345.48 |
| 2001/0035127 A1* | 11/2001 | Metzner | ................ | C23C 16/407 118/715 |
| 2002/0038688 A1* | 4/2002 | Nakano | ............... | C23C 16/5096 156/345.12 |
| 2003/0097984 A1* | 5/2003 | Nakano | ............ | H01J 37/32082 118/712 |
| 2003/0098127 A1* | 5/2003 | Nakano | ............ | H01J 37/32082 156/345.44 |
| 2005/0035770 A1* | 2/2005 | Hopkins | ............ | G01R 19/0061 324/655 |
| 2009/0081878 A1* | 3/2009 | Dhindsa | ............ | H01J 37/32091 438/729 |
| 2013/0260567 A1* | 10/2013 | Marakhtanov | .... | H01J 37/32165 438/710 |
| 2014/0054268 A1* | 2/2014 | Chen | ................. | H01J 37/32091 216/67 |

* cited by examiner

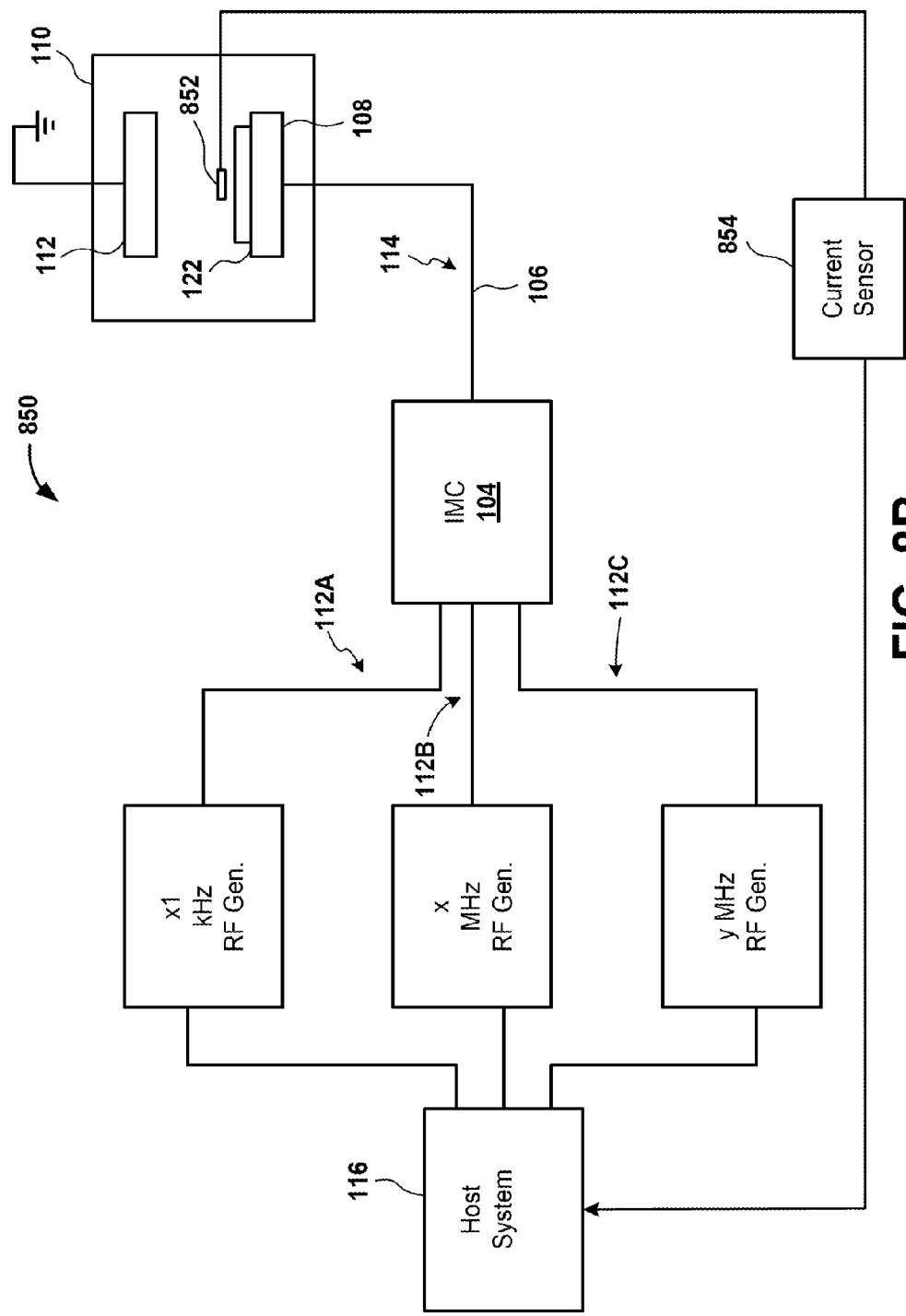

IMPEDANCE MATCHING CIRCUIT FOR OPERATION WITH A KILOHERTZ RF GENERATOR AND A MEGAHERTZ RF GENERATOR TO CONTROL PLASMA PROCESSES

CLAIM OF PRIORITY

The present patent application is a continuation of and claims priority, under 35 U.S.C. § 120, to U.S. patent application Ser. No. 14/636,007, filed on Mar. 2, 2015, and titled "IMPEDANCE MATCHING CIRCUIT FOR OPERATION WITH A KILOHERTZ RF GENERATOR AND A MEGAHERTZ RF GENERATOR TO CONTROL PLASMA PROCESSES", which is incorporated by reference herein in its entirety.

FIELD

The present embodiments relate to impedance matching for operation with a kilohertz (kHz) radio frequency (RF) generator and a megahertz (MHz) RF generator to control plasma processes.

BACKGROUND

In a plasma tool, a number of radio frequency (RF) generators are connected to a plasma chamber. The RF generators generate RF signals that may be pulsed and provide the RF signals to the plasma chamber to control various processes in the plasma chamber. A wafer is processed in the plasma chamber by plasma that is generated upon receiving the RF signals and a plasma process gas.

A manner of connecting the RF generators to the plasma chamber varies. For example, some RF generators are connected to a top electrode of the plasma chamber and the remaining RF generators are connected to a bottom electrode of the plasma chamber. Such separate connection help in separate control of the top and bottom electrode. However, the separate control is not cost-effective.

It is in this context that embodiments described in the present disclosure arise.

SUMMARY

Embodiments of the disclosure provide apparatus, methods and computer programs for impedance matching for operation with a kilohertz (kHz) radio frequency (RF) generator and a megahertz (MHz) RF generator to control plasma processes. It should be appreciated that the present embodiments can be implemented in numerous ways, e.g., a process, an apparatus, a system, a device, or a method on a non-transitory computer-readable medium. Several embodiments are described below.

In one embodiment, a kHz RF generator is connected to an impedance matching circuit (IMC) in addition to a low frequency MHz and/or a high frequency MHz RF generator. The IMC isolates an effect of an RF signal that is generated by the kHz RF generator from an RF signal that is generated by the low frequency or the high frequency MHz RF generator and matches an impedance of a load connected to the IMC with that of a source connected to the IMC to generate a modified signal. The modified signal is provided to an electrode of a plasma chamber.

The connection of the kHz and the low frequency MHz and/or the high frequency MHz RF generators to the same electrode via the IMC reduces a cost associated with connecting the kHz RF generator to an upper electrode of the plasma chamber and the low and high frequency MHz RF generators to a lower electrode of the plasma chamber. For example, when the kHz and the low frequency MHz and/or the high frequency MHz RF generators to the same electrode via the IMC, one IMC is used. Comparatively, when the kHz RF generator is connected to the upper electrode of the plasma chamber and the low and high frequency MHz RF generators are connected to the lower electrode of the plasma chamber, multiple IMCs are used. One IMC connects the kHz RF generator to the upper electrode and another IMC connects the low and high frequency RF generators to the lower electrode. Also, a first RF transmission line connects the IMC connected to the kHz RF generator to the plasma chamber and a second RF transmission line connects another IMC to the low and high frequency MHz RF generators. Multiple IMCs and multiple RF transmission lines add to costs, e.g., cost of housing of an IMC, costs of tuning an IMC, costs of multiple RF transmission lines, etc.

Moreover, the upper electrode that is connected to the kHz RF generator via the IMC includes insulator layers, e.g., an aluminum nitride layer, etc., that increases a cost of the upper electrode. The aluminum nitride layer acts as an insulator between an RF powered upper electrode and ground. Such costs are reduced by using an RF transmission line, an IMC, and an upper electrode that excludes the aluminum nitride layer. There is no need for an electrode, e.g., the upper electrode, etc., to have the aluminum nitride layer when the kHz and the low and/or high frequency MHz RF generators are connected to an oppositely located electrode, e.g., a lower electrode, etc., of the plasma chamber.

In an embodiment, an IMC is described. The impedance matching circuit includes a first circuit, which includes a first plurality of tuning elements. The first circuit has an input coupled to a kHz RF generator. The IMC includes a second circuit having a second plurality of tuning elements. The second circuit has an input coupled to a low frequency MHz RF generator. The second plurality of tuning elements of the second circuit is arranged in an adjacent orientation to the first plurality of tuning elements of the first circuit. The IMC includes a third circuit having a third plurality of tuning elements. The third circuit has an input coupled to a high frequency MHz RF generator. The third plurality of tuning elements of the third circuit is arranged in an adjacent orientation to the second plurality of tuning elements of the second circuit. The IMC includes an output of the first, second, and third circuits coupled to an input of an RF transmission line. An output of the RF transmission line is coupled to an electrode of a plasma chamber. The first circuit and the second circuit provide isolation between a kHz RF signal sent through the first circuit and a low frequency MHz RF signal sent through the second circuit. The isolation between the kHz RF signal and the low frequency MHz RF signal is provided by an increased number of tuning elements at an interface between the kHz and MHz RF signals as compared to an interface between the low frequency MHz RF signal and a high frequency MHz RF signal sent through the third circuit.

In one embodiment, an IMC including a first circuit is provided. The first circuit includes a first shunt circuit, a first series circuit coupled to the first shunt circuit, a second shunt circuit coupled to the first series circuit, a second series circuit coupled to the first series circuit and the second shunt circuit, a third shunt circuit coupled to the second series circuit, and a third series circuit coupled to the third shunt circuit and the second series circuit. The first circuit has an input coupled to a kHz RF generator. The IMC includes a second circuit. The second circuit includes a fourth series circuit, a fourth shunt circuit coupled to the fourth series circuit, a fifth series circuit coupled to the fourth series circuit and the fourth shunt circuit, a fifth shunt circuit coupled to the fifth series circuit, a sixth series circuit coupled to the fifth series circuit and the fifth series circuit, a sixth shunt circuit coupled to the sixth series circuit, and a seventh series circuit coupled to the sixth series circuit and the sixth shunt circuit. The second circuit has an input coupled to a low frequency MHz RF generator. The IMC includes a third circuit. The third circuit includes a seventh shunt circuit, an eighth shunt circuit coupled to the seventh shunt circuit, and an eighth series circuit coupled to the seventh shunt circuit and eighth shunt circuit. The third circuit has an input coupled to a high frequency MHz RF generator. Moreover, an output of the first, second, and third circuits coupled to an input of an RF transmission line, and an output of the RF transmission line is coupled to an electrode of a plasma chamber. The first circuit and the second circuit provide isolation between a kHz RF signal sent through the first circuit and a low frequency MHz RF signal sent through the second circuit. The isolation between the kHz RF signal and the low frequency MHz RF signal is provided by an increased number of tuning elements at an interface between the kHz and MHz RF signals as compared to an interface between the low frequency MHz RF signal and a high frequency MHz RF signal sent through the third circuit.

In an embodiment, a plasma processing system is described. The plasma processing system includes a kHz RF signal generator for generating a first RF signal. The plasma processing system further includes a low frequency MHz generator for generating a second RF signal and a high frequency MHz generator for generating a third RF signal. The plasma processing system includes an IMC coupled to the kHz RF generator, the low frequency MHz RF generator, and the high frequency MHz RF generator for receiving the first, second, and third RF signals to generate a modified RF signal. The IMC includes a first circuit coupled at an end to the kHz RF signal generator for transferring the first RF signal, a second circuit coupled at an end to the low frequency MHz RF generator for transferring the second RF signal, and a third circuit coupled at an end to the high frequency MHz RF generator for transferring the third RF signal. The first circuit includes a first number of tuning elements greater than a second number of tuning elements of the third circuit and the second circuit includes a third number of tuning elements greater than the second number of tuning elements of the third circuit to increase an amount of isolation between the first RF signal that is transferred via the first circuit and the second RF signal that is transferred via the second circuit compared to an amount of isolation between the second RF signal and the third RF signal. The plasma processing system includes a plasma chamber having an electrode for receiving the modified RF signal to generate plasma within the plasma chamber.

Some advantages of various embodiments of the systems and methods described herein include providing an IMC that facilitates coupling of the kHz RF generator and the low and/or high frequency MHz RF generator to an electrode of a plasma chamber. The IMC reduces an effect, e.g., cross-talk, electric effect, electromagnetic effect, etc., of an RF signal that is generated and sent by the kHz RF generator on an RF signal that is generated and sent by the low or high frequency MHz RF generator. Moreover, the IMC reduces an effect, e.g., cross-talk, electric effect, electromagnetic effect, etc., of the RF signal that is generated and sent by the low or high frequency MHz RF generator on the RF signal that is generated and sent by the kHz RF generator.

Other advantages of the systems and methods described herein include achieving a measurable factor, e.g. RF rod potential, wafer direct current (DC) bias voltage, plasma potential, etch rate, sputtering rate, ion energy, etc., by connecting the kHz and the low frequency and/or the high frequency RF generators to the plasma chamber via an IMC. The measurable factor is outside a range that is achievable when instead of the kHz RF generator, the low frequency and the high frequency and a higher frequency MHz RF generators are coupled to the plasma chamber via an IMC. Examples of the low frequency RF generator include a 2 MHz RF generator, the high frequency RF generator include a 27 MHz RF generator, and the higher frequency RF generator include a 60 MHz RF generator.

Yet other advantages of the systems and methods described herein include achieving a variety of levels of the measurable factor by controlling power levels of the kHz and the low frequency MHz and/or the high frequency MHz RF generators.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 8B is a block diagram of a plasma system for measurement of ion saturation current density, in accordance with an embodiment described in the present disclosure.

DETAILED DESCRIPTION

The following embodiments describe systems and methods for impedance matching for operation with a kilohertz (kHz) radio frequency (RF) generator and a megahertz (MHz) RF generator to control plasma processes. It will be apparent that the present embodiments may be practiced without some or all of these specific details. In other instances, well known process operations have not been described in detail in order not to unnecessarily obscure the present embodiments.

Figure 1A:
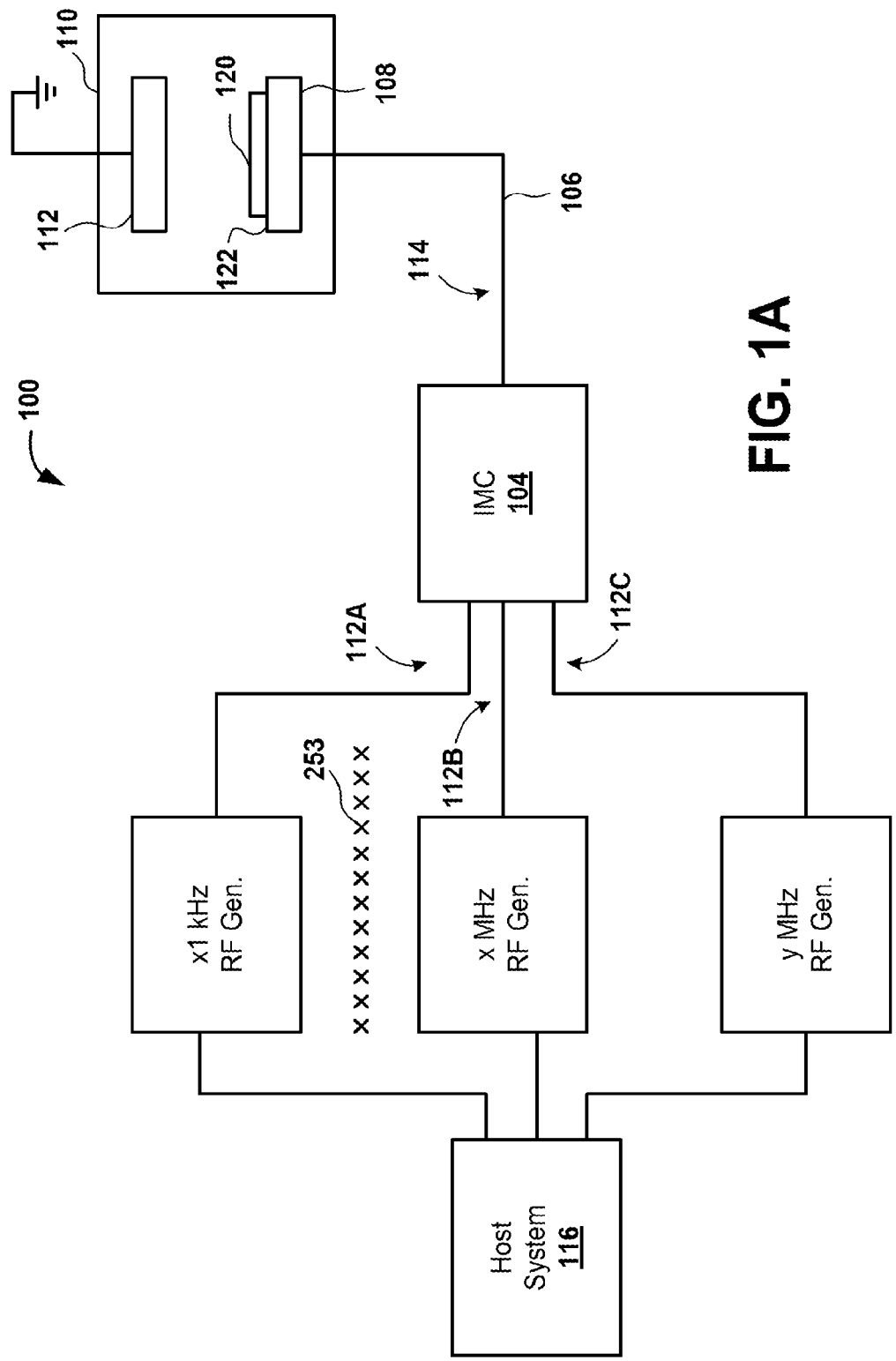
FIG. 1A is a diagram of a plasma system for illustrating connection of an impedance matching circuit (IMC) with a kilohertz (kHz) radio frequency (RF) generator and a low frequency megahertz (MHz) RF generator and/or a high frequency MHz RF generator, in accordance with an embodiment described in the present disclosure.

FIG. 1A is a diagram of an embodiment of a plasma system 100 for illustrating connection of an impedance matching circuit (IMC) 104 with an x1 kHz RF generator and an x MHz RF generator. The x MHz RF generator is a low frequency RF generator that generates an RF signal of a low frequency. The impedance matching circuit 104 is also connected to a y MHz RF generator, which is a high frequency RF generator that generates a signal of a high frequency. As an example, the x1 kHz RF generator has frequencies ranging between 20 kHz and 1 MHz. Moreover, as an example, the low frequency x MHz RF generator has frequencies ranging between 1 MHz and 4 MHz, and the high frequency y MHz RF generator has frequencies ranging between 13 MHz and 200 MHz.

An input of the IMC 104 is connected to an output of the x1 kHz RF generator via an RF cable 112A, another input of the IMC 104 is connected to an output of the x MHz RF generator via another RF cable 112B, and yet another input of the IMC 104 is connected to an output of the y MHz RF generator via yet another RF cable 112C. Moreover, an output of the IMC 104 is coupled to an RF transmission line 106. For example, the output of the IMC 104 is connected to the RF transmission line 106 via an RF strap. The RF transmission line 106 includes an RF rod that is surrounded by an insulator.

The RF transmission line 106 is connected to a chuck 108 of a plasma chamber 110. As an example, the chuck 108 includes a lower electrode and a ceramic layer placed with respect to, e.g., on top of, etc., the lower electrode. As another example, the chuck 108 includes the lower electrode, the ceramic layer, and a facility plate placed with respect to, e.g., below, etc., the lower electrode. The lower electrode of the chuck 108 is made of a metal, e.g., anodized aluminum, alloy of aluminum, etc.

The plasma chamber 110 further includes an upper electrode 112. The upper electrode 112 is made of an electrically conductive material, e.g., aluminum, alloy of aluminum, low resistivity silicon, etc. The upper electrode 112 is located opposite to and facing the lower electrode of the chuck 108. The upper electrode 112 is grounded, e.g., coupled to a reference voltage, coupled to zero voltage, coupled to a negative voltage, etc. A substrate 120 is placed on a top surface 122 of the chuck 108 for processing, e.g., depositing materials on the substrate 120, or cleaning the substrate 120, or etching deposition layers from the substrate 120, or doping the substrate, or sputtering the substrate 120, or a combination thereof.

A host system 116, e.g., a computer, a controller, a processor, etc., is connected to inputs of the x1 kHz RF generator, the x MHz RF generator, and the y MHz RF generator to provide a recipe control signal, e.g., a signal including a power level, a signal including a frequency level, etc., to each of the x1 kHz, the x MHz, and the y MHz RF generators. Other examples of the host system 116 include a central processing unit (CPU), an application specific integrated circuit (ASIC), a programmable logic device (PLD), a field programmable gate array (FPGA), etc.

Upon receiving the recipe control signal, each RF generator generates an RF signal having the frequency and power levels. For example, the x1 kHz RF generator includes a digital signal processor (DSP), which upon receiving the recipe control signal drives an RF power supply, e.g., an RF oscillator, an RF power source, etc., to generate an RF signal at an output of the x1 kHz RF generator, and the RF signal has a power level and a frequency level, both of which are included in the recipe control signal. The x1 kHz RF generator generates an RF signal having a frequency of x1 kHz, the x kHz RF generator generates an RF signal having a frequency of x MHz, and the y MHz RF generator generates an RF signal having a frequency of y MHz.

The IMC 104 receives the RF signals via the RF cables 112A, 112B, and 112C from the x1 kHz, x MHz, and y MHz RF generators, and matches an impedance of a load connected to one or more outputs of the IMC 104 with that of a source connected to one or more inputs of the IMC 104 to generate a modified RF signal 114. Examples of the source include the x1 kHz, x MHz, and y MHz RF generators and the RF cables 112A, 112B, and 112C that couple the RF generators to the IMC 104. Examples of the load include the RF transmission line 106 and the plasma chamber 110. The modified RF signal 114 is provided by the IMC 104 via the RF transmission line 106 to the chuck 108.

At a time the modified RF signal 114 is supplied from the IMC 104 to the chuck 108, a process gas, e.g., an oxygen-containing gas, a fluorine-containing gas, a gas containing carbon and fluorine, etc. is supplied between the upper electrode 112 and the chuck 108 via gas inlets in the upper electrode 112. An example of the oxygen-containing gas includes oxygen and examples of the fluorine-containing gas include tetrafluoromethane ($CF_4$), sulfur hexafluoride ($SF_6$), hexafluoroethane ($C_2F_6$), $C_4F_6$ gas, $C_4F_3$ gas, $C_3F_8$ gas, etc. When both the process gas and the modified RF signal 114 are supplied to the plasma chamber 110, plasma is generated or is maintained within the plasma chamber 110.

In an embodiment, a level of a parameter, e.g., frequency, power, etc., includes one or more power amounts. Moreover, a level of a parameter is exclusive of amounts of the parameter at another level of the parameter. For example, a power level of 2000 watts includes power amounts ranging from 1950 watts to 2050 watts and is exclusive of a power level of 1000 watts. The power level of 1000 watts includes power amounts ranging from 950 watts to 1050 watts. As another example, a power level of 0 watts includes power amounts ranging from 0 watts to 20 watts and is exclusive of a power level of 500 watts. The power level of 500 watts includes power amounts ranging from 490 watts to 510 watts.

In one embodiment, the plasma system 100 includes any other number of RF generators. For example, the plasma system 100 includes the x1 kHz and the low frequency x MHz RF generator without including the high frequency y MHz RF generator. As another example, the plasma system 100 includes the x1 kHz and the high frequency y MHz RF generator without including the low frequency x MHz RF generator.

In an embodiment, instead of connecting the RF transmission line 106 to the chuck 108, the RF transmission line 106 is connected to the upper electrode 112 and the lower electrode of the chuck 108 is grounded.

In one embodiment, an operational frequency of the y MHz RF generator is greater than an operational frequency of the x MHz RF generator. For example, the y MHz RF generator generates an RF signal that has a higher frequency than a frequency of an RF signal that is generated by the y MHz RF generator. As another example, a frequency of oscillation of an RF power supply of the y MHz RF generator is greater than a frequency of oscillation of an RF power supply of the x MHz RF generator.

In one embodiment, the source changes with a change in a number of generators that are connected to the IMC 104.

For example, when the x1 kHz and x MHz RF generators are connected to the IMC 104 via RF cables 112A and 112B, the source is the x1 kHz RF generator, the x MHz RF generator, the RF cable 112A that connects the x1 kHz RF generator to the IMC 104, and the RF cable 112B that connects the x MHz RF generator to the IMC 104. As another example, when the x1 kHz, x MHz, and y MHz RF generators are connected to the IMC 104 via RF cables 112A, 112B, and 112C, the source is the x1 kHz RF generator, the x MHz RF generator, the y MHz RF generator, the RF cable 112A that connects the x1 kHz RF generator to the IMC 104, the RF cable 112B that connects the x MHz RF generator to the IMC 104, and the RF cable 112C that connects the y MHz RF generator to the IMC 104.

Figure 1B:
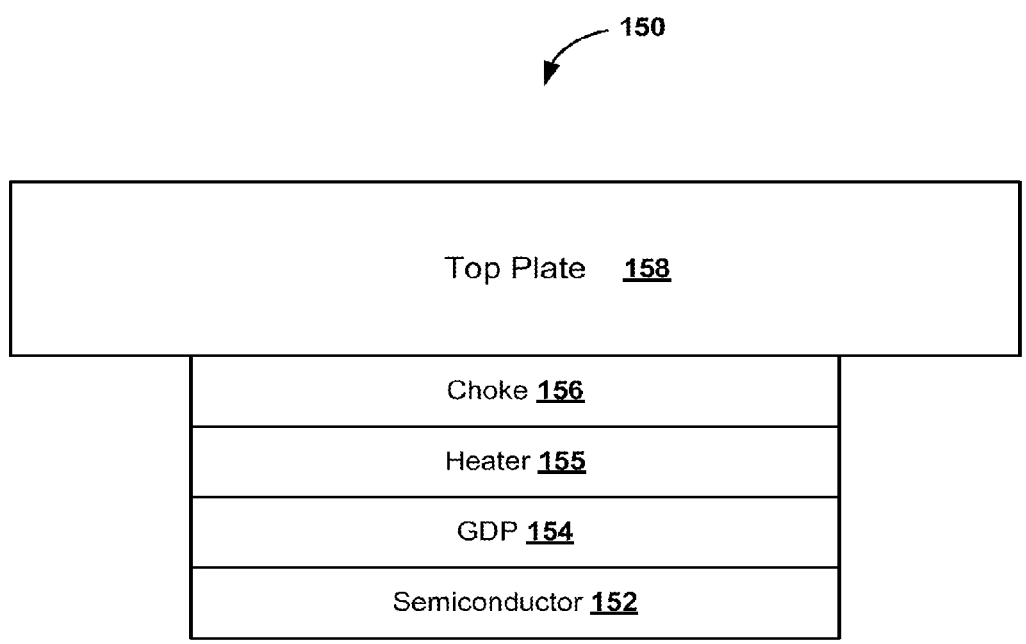
FIG. 1B is a diagram of an upper electrode of the plasma system, in accordance with an embodiment described in the present disclosure.

FIG. 1B is a diagram of an embodiment of an upper electrode 150 of the plasma system 100 (FIG. 1A). The upper electrode 150 is an example of the upper electrode 112 (FIG. 1A). The upper electrode 150 includes a semiconductor layer 152, e.g., a silicon layer, etc. The semiconductor layer 152 is used to conducting an RF signal, e.g., the modified signal 114 (FIG. 1A), etc. A gas distribution plate (GDP) 154 is overlaid on top of the semiconductor layer 152. The gas distribution plate includes multiple inlets, e.g., holes, etc., that facilitate provision and distribution of a process gas into a cavity formed between the upper electrode 150 and the chuck 108 (FIG. 1A).

Moreover, a heater 155 is overlaid on top of the GDP 154. The heater heats to increase temperature within the plasma chamber 110 to control a process occurring within the plasma chamber 110. A thermal choke 156 is overlaid on top of the heater 155. The thermal choke 156 acts as a restrictor, e.g., an insulator, etc., of heat produced by the heater 155 and other parts, e.g., a top plate 158, etc., of the plasma chamber 110 (FIG. 1A). The top plate 158 is overlaid on top of the thermal choke 156. The thermal choke 156 is coupled to the top plate 158 and the top plate 158 acts as a support for the thermal choke 156, the heater 155, the GDP 154, and the semiconductor 152.

It should be noted that the upper electrode 152 does not include an insulator layer, e.g., an aluminum nitride (AlN) layer, etc., between the heater 155 and the GDP 154. Use of the insulator layer substantially increases a cost of an upper electrode (not shown). Such upper electrode (not shown) with the insulator layer is used when the x1 kHz RF generator is connected to the upper electrode having the insulator layer. Moreover, an additional insulator is provided between a top plate (not shown) of the upper electrode (not shown) and an RF match circuit that is connected to the upper electrode (not shown). The additional insulator further increases the costs of using a plasma tool in which the upper electrode is connected to the x1 kHz RF generator via an IMC (not shown) and an RF transmission line (not shown).

In one embodiment, the semiconductor layer 152, the GDP 154, the thermal choke 156, and the top plate 158 are discs that are coaxially located to be concentric with respect to each other.

Figure 2A:
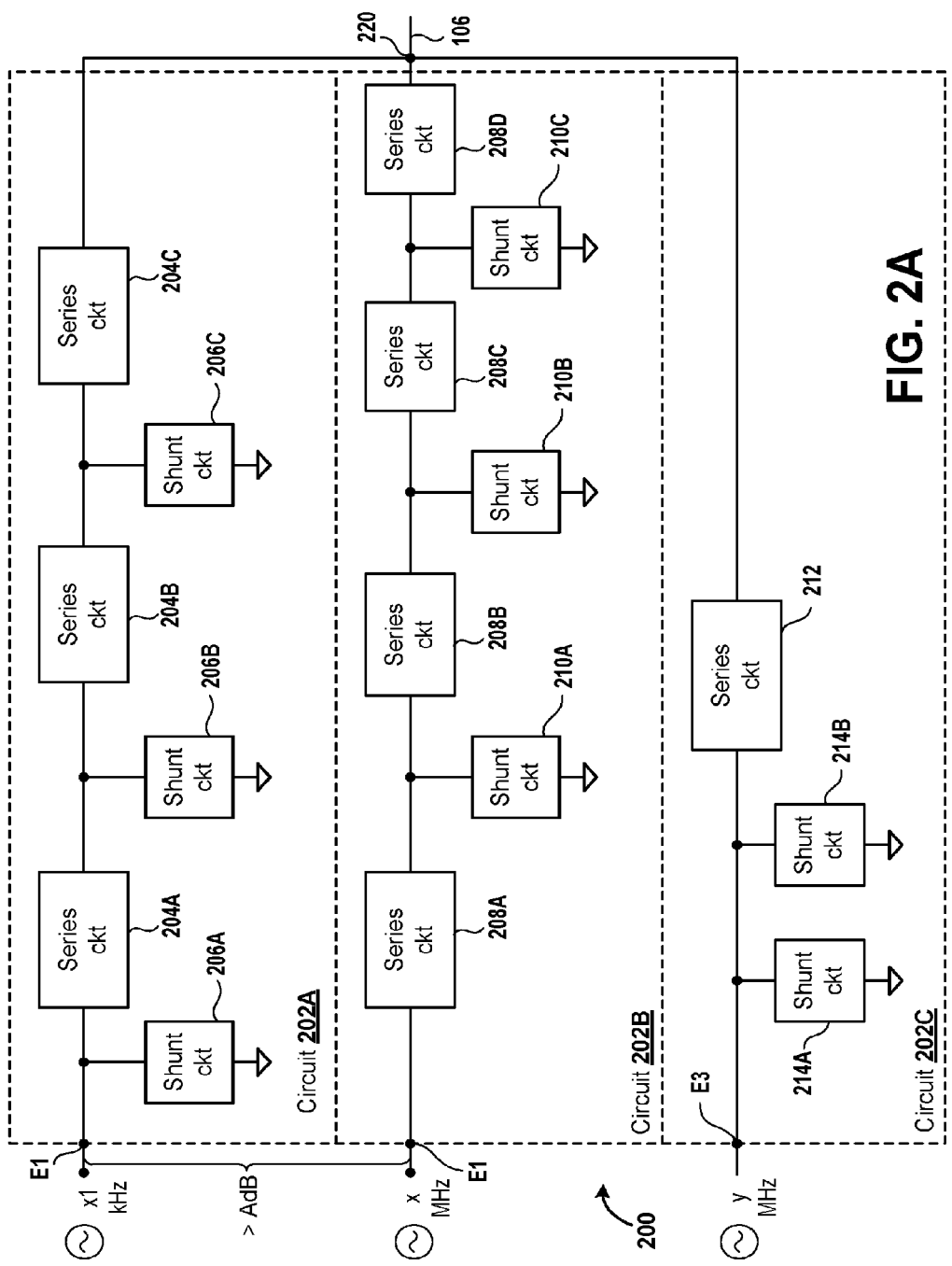
FIG. 2A is a diagram of an IMC, in accordance with an embodiment described in the present disclosure.

FIG. 2A is a diagram of an embodiment of an IMC 200, which is an example of the IMC 104 (FIG. 1A). The IMC 200 includes a circuit 202A, a circuit 202B, and a circuit 202C. The circuit 202B is adjacent to the circuit 202A and the circuit 202C is adjacent to the circuit 202B. The circuit 202A includes a series circuit 204A, another series circuit 204B, and yet another series circuit 204C. Moreover, the circuit 202A includes a shunt circuit 206A, another shunt circuit 206B, and yet another shunt circuit 206C. Examples of a series circuit include one or more inductors, one or more capacitors, or a combination thereof. Examples of a shunt circuit include one or more capacitors. Each shunt circuit is connected to a ground connection at one end.

Also, the circuit 202B includes a series circuit 208A, a series circuit 208B, and yet another series circuit 208C. Moreover, the circuit 202B includes a shunt circuit 210A, a shunt circuit 210B, and a shunt circuit 210C. The circuit 202C includes a series circuit 212, a shunt circuit 214A, and a shunt circuit 214B. Each series circuit or a shunt circuit is sometime referred to herein as a tuning element.

The circuit 202A is connected at its input, e.g., an input of the series circuit 204A, an end E1, etc., to an output of the x1 kHz RF generator (FIG. 1A) via the RF cable 212A. Moreover, the circuit 202B is connected at its input, e.g., an end E2, an input of the series circuit 208A, etc., to an output of the x MHz RF generator via the RF cable 212B. Also, the circuit 202C is connected at its input, e.g., an end E3, etc., an input of the series circuit 212, etc., to an output of the y MHz RF generator via the RF cable 212C.

A tuning element of a circuit, e.g., circuit 202A, circuit 202B, circuit 202C, etc., acts as a blocking component that blocks an effect, e.g., an electric field, a magnetic field, etc., that is created by a transfer of an RF signal in an adjacent circuit. For example, the series circuits 204A, 204B, 204C, and the shunt circuits 206A, 206B, and 206C blocks an effect of an RF signal that is transferred via the circuit 202B. As another example, the series circuits 208A, 208B, 208C, and 208D, and the shunt circuits 210A, 210B, and 210C block an effect of an RF signal that is transferred via the circuit 202A and another RF signal that is transferred via the circuit 202C. As yet another example, the series circuit 212 and the shunt circuits 214A and 214B block an effect of an RF signal that is transferred via the circuit 202B.

An example of an RF signal that is transferred via a circuit, e.g., circuit 202A, circuit 202B, circuit 202C, etc., includes a supplied signal that is generated by and received from an RF generator that is coupled to the circuit. Another example of an RF signal that is transferred via circuit, e.g., circuit 202A, circuit 202B, circuit 202C, etc., includes a reflected signal that is reflected from the plasma chamber 110 (FIG. 1A), via the RF transmission line 106 (FIG. 1A) and the circuit towards an RF generator that is coupled to the circuit.

In one embodiment, a shunt circuit creates a low resistance path to allow passage of an electric current. For example, the shunt circuit 206A creates a low resistance path to ground for an electric current of an RF signal that passes through the circuit 202A. The circuits 202A, 202B, and 202C are connected at an end 220 of each circuit to the RF transmission line 106.

The circuit 202A receives an RF signal that is generated and supplied by the x1 kHz RF generator, the circuit 202B receives an RF signal that is generated and supplied by the x MHz RF generator, and the circuit 202C receives an RF signal that is generated and supplied by the y MHz RF generator. The circuit 202A isolates an effect of the RF signal that is sent via the circuit 202B to the end 220 and the circuit 220B isolates an effect of the RF signal that is sent via the circuit 202A to the end 220. Also, the circuit 202B isolates an effect of the RF signal that is sent via the circuit 202C to the end 220 and the circuit 202C isolates an effect of the RF signal that is sent via the circuit 202B to the end 220. The RF signal received from the x1 kHz RF generator is sent via the series circuits 204A thru 204C to the end 220. Moreover, the RF signal received from the x MHz RF generator is sent via the series circuits 208A thru 208D to the end 220 and the RF signal received from the y MHz RF generator is sent via the series circuit 212 to the end 220.

After isolating effects of the supplied RF signals from each other as described above, the RF signals received at the end 220 via the circuits 202A thru 202C are combined, e.g., added, etc., at the end 220 and the IMC 200 matches an impedance of the load with the source to generate the modified RF signal 114 (FIG. 1A).

Also, during a time plasma is generated or maintained within the plasma chamber 110 (FIG. 1A), power from the plasma is reflected back in a form of a reflected RF signal towards the x1 kHz, x MHz, and y MHz RF generators via the RF transmission line 106. The reflected RF signal is divided at the end 220 between the circuits 202A thru 202C. Power of a portion of the reflected RF signal that is received from the end 220 and reflected back towards the x MHz RF generator via the circuit 202B is isolated from power of a portion of the reflected RF signal that is received from the end 220 and reflected back towards the x1 kHz RF generator via the circuit 202A. Moreover, power of a portion of the reflected RF signal that is received from the end 220 and reflected back towards the x1 kHz RF generator via the circuit 202A is isolated from power of the portion of the reflected RF signal that is received from the end 220 and reflected back towards the x MHz RF generator via the circuit 202B. Also, power of a portion of the reflected RF signal that is received from the end 220 and reflected back towards the y MHz RF generator via the circuit 202C is isolated from the power of the portion of the reflected RF signal that is received from the end 220 and reflected back towards the x MHz RF generator via the circuit 202B. Power of the portion of the reflected RF signal that is received from the end 220 and reflected back towards the x MHz RF generator via the circuit 202B is isolated from the power of the portion of the reflected RF signal that is received from the end 220 and reflected back towards the y kHz RF generator via the circuit 202C. At the same time, the portions of the reflected RF signal are being isolated from each other, the IMC 200 matches an impedance of the load with that of the source to generate a reflected RF signal that is received by the x1 kHz RF generator via the circuit 202A, to generate a reflected RF signal that is received by the x MHz RF generator via the circuit 202B, and to generate a reflected RF signal that is received by the y MHz RF generator via the circuit 202C.

In an embodiment, the circuit 202A includes a greater number of blocking components, e.g., the series circuits 204A, 204B, and 204C and the shunt circuits 206A, 206B, and 206C, etc., than that coupled to and between ends E1 and 220 of the circuit 202A when the circuit 202A is coupled at its input, e.g., the end E1, etc., to the x MHz RF generator instead of the x1 kHz RF generator. Also, the circuit 202B includes a greater number of blocking components, e.g., the series circuits 208A, 208B, 208C, and 208D and the shunt circuits 210A, 210B, and 210C, etc., than that coupled to and between ends E2 and 220 of the circuit 202B when the circuit 202B is coupled at its input, e.g., the end E2, etc., to the y MHz RF generator instead of to the x MHz RF generator. The greater number of blocking components in each of the circuits 202A and 202B facilitates reducing, e.g., blocking, decreasing, minimizing, etc., an effect of an RF signal that is transferred via the circuit 202A that is connected to the x1 kHz RF generator and facilitates reducing, e.g., blocking, etc., an effect of an RF signal that is transferred via the circuit 202B that is connected to the x MHz RF generator. For example, an isolation 253 (FIG. 1A) between power of an RF signal that is transferred via the circuit 202A and power of an RF signal that is transferred via the circuit 202B is greater than A decibels, e.g., greater than 15 decibels, greater than 20 decibels, greater than 25 decibels, etc. The greater number of blocking components in each circuit 202A and 202B provides a greater amount of isolation 253 between RF signals that are transferred via the corresponding circuits 202A and 202B than that provided between RF signals that are transferred when the end E1 of the circuit 202A is connected to the x MHz RF generator and the end E2 of the circuit 202B is connected to the y MHz RF generator.

In one embodiment, a number of blocking components in each circuit 202A and 202B is greater than a number of blocking components in the circuit 202C. For example, the circuit 202B includes a greater number of circuits 208A, 208B, 208C, 208D, 210A, 210B, 210C than a number of the circuits 212, 214A, and 214B of the circuit 202C to provide isolation from an RF signal that is transferred via the circuit 202A. As another example, the circuit 202A includes a greater number of circuits 204A, 204B, 204C, 206A, 206B, and 206C than a number of the circuits 212, 214A, and 214B of the circuit 202C to provide isolation from an RF signal that is transferred via the circuit 202B. The greater number of blocking components in each circuit 202A and 202B increases an amount of isolation between power of an RF signal that is transferred via the circuit 202A and power of an RF signal that is transferred via the circuit 202B compared to an amount of isolation between power of the RF signal that is transferred via the circuit 202B and power of an RF signal that is transferred via the circuit 202C. For example, the amount of isolation A dB is greater than an amount of isolation B dB between power of an RF signal that is transferred via the circuit 202B and power of an RF signal that is transferred via the circuit 202C.

In one embodiment, a transfer, as used herein, of an RF signal is in a send direction from an RF generator to an RF transmission line or in a reflected direction from a plasma chamber to the RF generator. In an embodiment, a transfer, as used herein, is in a send direction from an RF generator to an RF transmission line or in a reflected direction from a plasma chamber and the RF transmission line to the RF generator.

Figure 2B:
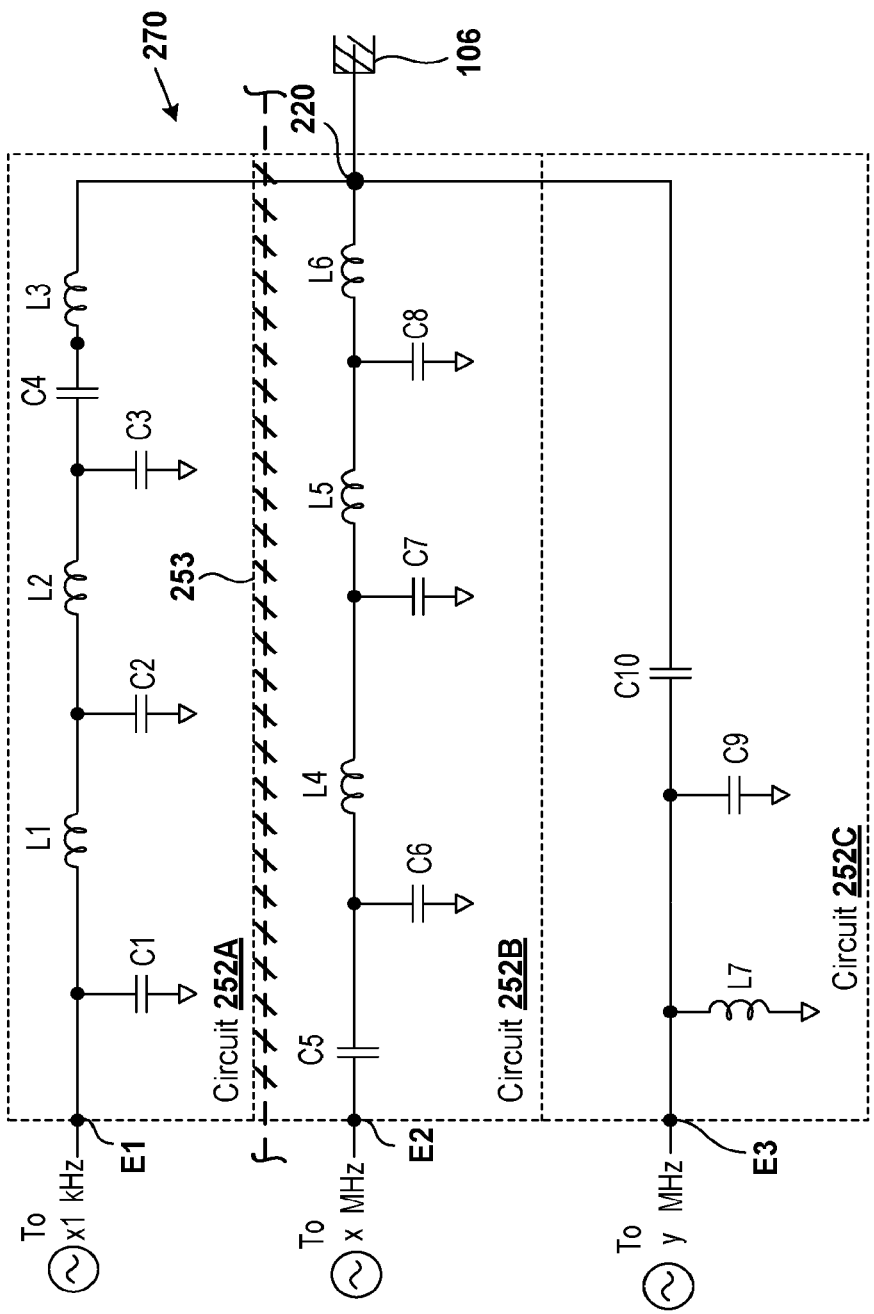
FIG. 2B is a diagram of another IMC, in accordance with an embodiment described in the present disclosure.

FIG. 2B is a diagram of an embodiment of an IMC 270, which is an example of the IMC 200 (FIG. 2A). The IMC 270 includes inductors and capacitors. For example, a circuit 252A of the IMC 270 that is connected to the x1 kHz RF generator includes an inductor L1, another inductor L2, a capacitor C4, an inductor L3, a capacitor C1, a capacitor C2, and a capacitor C3. The inductor L1 is an example of the series circuit 204A (FIG. 2A), the inductor L2 is an example of the series circuit 204B (FIG. 2A), and a series circuit of the inductor L3 and the capacitor C4 is an example of the series circuit 204C (FIG. 2A), the capacitor C1 is an example of the shunt circuit 206A (FIG. 2A), the capacitor C2 is an example of the shunt circuit 206B (FIG. 2A), and the capacitor C3 is an example of the shunt circuit 206C (FIG. 2A). As another example, a circuit 252B of the IMC 270 that is connected to the x MHz RF generator includes a capacitor C5, a capacitor C6, an inductor L4, a capacitor C7, an inductor L5, a capacitor C8, and an inductor L6. The capacitor C5 is an example of the series circuit 208A (FIG. 2A), the inductor L4 is an example of the series circuit 208B (FIG. 2A), the inductor L5 is an example of the series circuit 208C (FIG. 2A), the inductor L6 is an example of the series circuit 208D (FIG. 2A), the capacitor C6 is an example of the shunt circuit 210A (FIG. 2A), the capacitor C7 is an example of the shunt circuit 210B (FIG. 2A), and the capacitor C8 is an example of the shunt circuit 210C (FIG. 2A). As yet another example, a circuit 252C of the IMC 270 that is connected to the y MHz RF generator includes an inductor L7, a capacitor C9, and a capacitor C10. The capacitor C10 is an example of the series circuit 212 (FIG. 2A), the inductor L7 is an example of the shunt circuit 214A (FIG. 2A), and the capacitor C9 is an example of the shunt circuit 214B (FIG. 2A).

The inductor L1 is connected to the capacitor C1 and to the end E1. The capacitor C2 is connected to the inductor L1. The inductor L2 is connected to the capacitor C2 and to the inductor L1. The capacitor C3 is connected to the inductor L2. The capacitor C4 is connected to the inductor L2 and to the capacitor C3. The inductor L3 is in series with the capacitor C4 and is connected to the end 220.

The capacitor C5 is connected to the end E2 and to the capacitor C6. The inductor L4 is connected to the capacitors C5 and C6. The capacitor C7 is connected to the inductor L4. The inductor L5 is connected to the capacitor C7 and to the inductor L4. The capacitor C8 is connected to the inductor L5. The inductor L6 is connected to the inductor L5 and to the capacitor C8 and to the end 220.

The inductor L7 is connected to the end E3 and to the capacitor C9. The capacitor C10 is connected to the capacitor C9, the inductor L7, and to the end 220.

In one embodiment, instead of using a component, e.g., a capacitor, an inductor, etc., of the IMC 270, multiple components are connected to each other to achieve a characteristic, e.g., capacitance, inductance, etc., of the component. For example, instead of the capacitor C4, multiple capacitors are coupled in parallel with each other to achieve a capacitance of the capacitor C4. As another example, instead of the capacitor C3, multiple capacitors are coupled in parallel to achieve a capacitance of the capacitor C3.

In an embodiment, a total inductance of blocking components of the circuit 252A, e.g., total inductance of the inductors L1 thru L3, etc., that is connected to the x1 kHz RF generator, is greater than a total inductance of blocking components between the end E1 and the end 220 when the end E1 is connected to the x MHz RF generator and not to the x1 kHz RF generator. In an embodiment, a total capacitance of blocking components of the circuit 252A, e.g., total capacitance of the capacitors C1 thru C4, etc., that is connected to the x1 kHz RF generator, is greater than a total capacitance of blocking components between the end E1 and the end 220 when the end E1 is connected to the x MHz RF generator and not to the x1 kHz RF generator.

In an embodiment, a number of blocking inductors of the circuit 252A, e.g., the inductors L1 thru L3, etc., that is connected to the x1 kHz RF generator, is greater than a number of blocking inductors coupled between and to the ends E1 and 220 when the end E1 is connected to the x MHz RF generator and not to the x1 kHz RF generator. In an embodiment, a total number of blocking capacitors of the circuit 252A, e.g., the capacitors C1 thru C4, etc., that is connected to the x1 kHz RF generator, is greater than a total number of blocking capacitors coupled to and between the ends E1 and 220 when the end E1 is connected to the x MHz RF generator and not to the x1 kHz RF generator.

In one embodiment, a total inductance of blocking components of the circuit 252A, e.g., total inductance of the inductors L1 thru L3, etc., that is connected to the x1 kHz RF generator is greater than a total inductance of blocking components of the circuit 252C that is connected to the y MHz RF generator. In one embodiment, a total capacitance of blocking components of the circuit 252A, e.g., total capacitance of the capacitors C1 thru C4, etc., that is connected to the x1 kHz RF generator is greater than a total capacitance of blocking components of the circuit 252C, e.g., total capacitance of the capacitors C9 and C10, etc., that is connected to the y MHz RF generator.

In one embodiment, a total inductance of blocking components of the circuit 252B, e.g., total inductance of the inductors L4 thru L6, etc., which is connected to the x MHz RF generator is greater than a total inductance of blocking components between ends E2 and 220 when the end E2 is connected to the y MHz RF generator and not to the x MHz RF generator. In one embodiment, a total capacitance of blocking components of the circuit 252B, e.g., total capacitance of the capacitors C5 thru C8, etc., which is connected to the x MHz RF generator is greater than a total capacitance of blocking components between ends E2 and 220 when the end E2 is connected to the y MHz RF generator and not to the x MHz RF generator.

In an embodiment, a number of blocking inductors of the circuit 252B, e.g., the inductors L4 thru L6, etc., that is connected to the x kHz RF generator, is greater than a number of blocking inductors coupled between and to the ends E2 and 220 when the end E2 is connected to the y MHz RF generator and not to the x MHz RF generator. In an embodiment, a total number of blocking capacitors of the circuit 252B, e.g., total capacitance of the capacitors C5 thru C8, etc., that is connected to the x MHz RF generator, is greater than a total number of blocking capacitors coupled to and between the ends E2 and 220 when the end E2 is connected to the y MHz RF generator and not to the x MHz RF generator.

In one embodiment, a total inductance of blocking components of the circuit 252B, e.g., total inductance of the inductors L4 thru L6, etc., which is connected to the x MHz RF generator is greater than a total inductance of blocking components of the circuit 252C that is connected to the y MHz RF generator. In one embodiment, a total capacitance of blocking components of the circuit 252B, e.g., total capacitance of the capacitors C5 thru C8, etc., that is connected to the x MHz RF generator is greater than a total capacitance, e.g. total capacitance of the capacitors C9 and C10, etc., of blocking components of the circuit 252C that is connected to the y MHz RF generator.

Figure 3A:
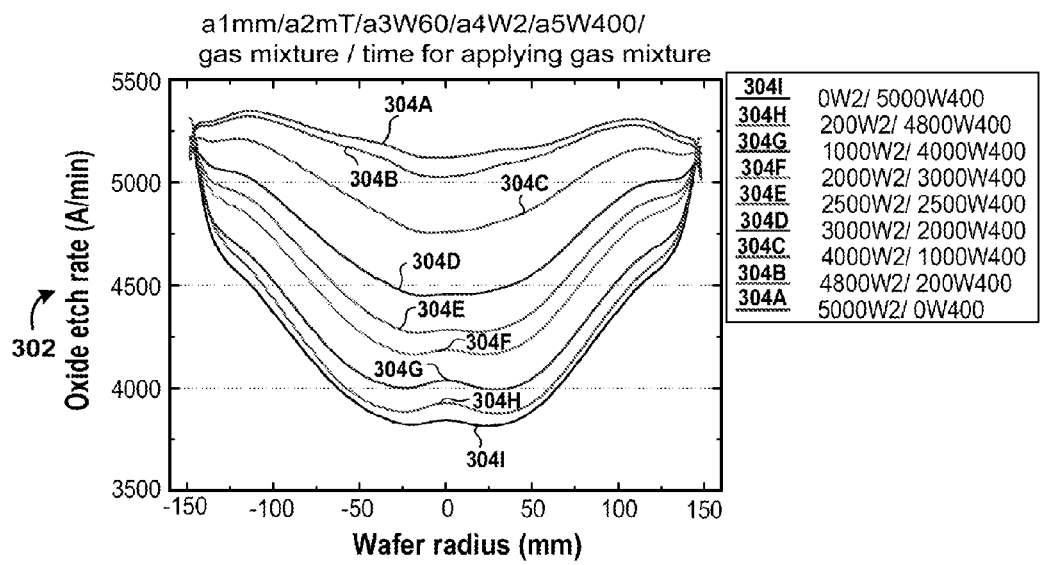
FIG. 3A is a diagram of a graph that plots an etch rate versus a radius of a substrate, in accordance with an embodiment described in the present disclosure.

FIG. 3A is a diagram of an embodiment of a graph 302 that plots an etch rate versus a radius of the substrate 120 (FIG. 1A). The graph 302 includes plots 304A, 304B, 304C, 304D, 304E, 304F, 304G, 304H, and 304I for different combinations of power levels of the x1 kHz RF generator and the x MHz RF generator. For example, the plot 304A is generated when a 400 kHz RF generator operates to generate an RF signal having a power level of 0 watts, e.g., between 0 and 10 watts, etc., and the 2 MHz RF generator operates to generate an RF signal having a power level of 5000 watts. As another example, the plot 304B is generated when the 400 kHz RF generator operates to generate an RF signal having a power level of 200 watts and the 2 MHz RF generator operates to generate an RF signal having a power level of 4800 watts. As yet another example, the plot 304C is generated when the 400 kHz RF generator operates to generate an RF signal having a power level of 1000 watts and the 2 MHz RF generator operates to generate an RF signal having a power level of 4000 watts. As another example, the plot 304D is generated when the 400 kHz RF generator operates to generate an RF signal having a power level of 2000 watts and the 2 MHz RF generator operates to generate an RF signal having a power level of 3000 watts. As yet another example, the plot 304E is generated when the 400 kHz RF generator operates to generate an RF signal having a power level of 2500 watts and the 2 MHz RF generator operates to generate an RF signal having a power level of 2500 watts. As another example, the plot 304F is generated when the 400 kHz RF generator operates to generate an RF signal having a power level of 3000 watts and the 2 MHz RF generator operates to generate an RF signal having a power level of 2000 watts. As yet another example, the plot 304G is generated when the 400 kHz RF generator operates to generate an RF signal having a power level of 4000 watts and the 2 MHz RF generator operates to generate an RF signal having a power level of 1000 watts. As another example, the plot 304H is generated when the 400 kHz RF generator operates to generate an RF signal having a power level of 4800 watts and the 2 MHz RF generator operates to generate an RF signal having a power level of 200 watts. As yet another example, the plot 304I is generated when the 400 kHz RF generator operates to generate an RF signal having a power level of 5000 watts and the 2 MHz RF generator operates to generate an RF signal having a power level of 0 watts, e.g., 0-10 watts, etc.

It should be noted that a removal rate, e.g., an etch rate, a sputtering rate, etc., at an edge region of the plasma chamber 110 (FIG. 1A) is increased or decreased by controlling an amount of power and frequency of an RF signal that is generated by the x1 kHz RF generator and an etch rate at a center region of the plasma chamber 110 is increased or decreased by controlling an amount of power and frequency of an RF signal that is generated by the x MHz RF generator. For example, as a power level of an RF signal that is generated by the x1 kHz RF generator increases, there is an increase in a rate of increase in etch rate at the edge region and as the power level decreases, there is a decrease in the rate of increase in etch rate at the edge region. As another example, as a power level of an RF signal that is generated by the x1 kHz RF generator increases, there is an increase in etch rate at the edge region and as the power level decreases, there is a decrease in the etch rate at the edge region. As another example, as a power level of an RF signal that is generated by the x MHz RF generator increases, there is an increase in an etch rate at the center region and as the power level decreases, there is a decrease in the etch rate at the center region. As yet another example, for the same amount of change in a power level in an RF signal that is generated by the x1 kHz RF generator and a power level of an RF signal that is generated by the x MHz RF generator, there is a greater amount of change in etch rate at the edge region attributable to the x1 kHz RF generator than an amount of change in the etch rate at the edge region attributable to the x MHz RF generator.

In an embodiment, the center region is defined as a region between the upper electrode 112 (FIG. 1A) and the chuck 108 (FIG. 1A). Moreover, the edge region is defined as a region that is not under the upper electrode 112 and not over the chuck 108. The edge region is closer to a C-shroud, described below, of the plasma chamber 110 than the center region.

In one embodiment, a center of a substrate coincides with a center of the lower electrode. For example, in the graph 302, a center of a wafer is the same as that of a center of the lower electrode and a radius of the wafer extends along a radius of the lower electrode.

In one embodiment, instead of using the x MHz RF generator, the y MHz RF generator or a combination of the x and y MHz RF generators is used to control an etch rate at the center region of the plasma chamber 110.

Figure 3B:
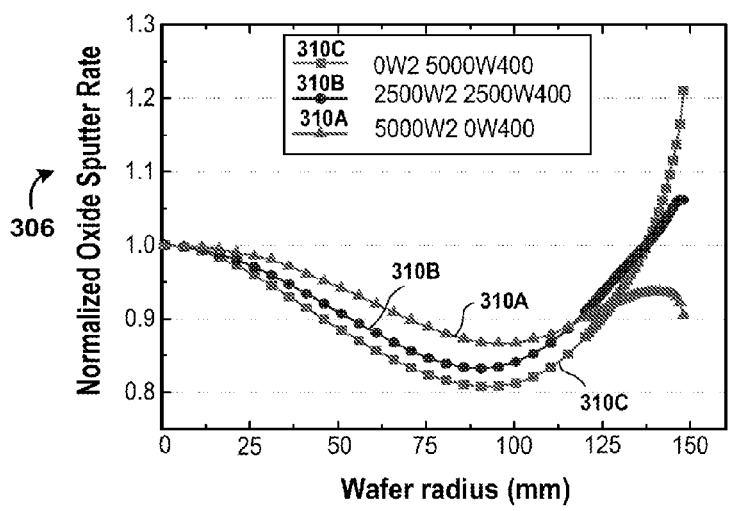
FIG. 3B is a graph that plots a sputtering rate of sputtering an oxide deposited on the substrate versus a radius of the substrate, in accordance with an embodiment described in the present disclosure.

FIG. 3B is an embodiment of a graph 306 that plots a sputtering rate of sputtering an oxide deposited on the substrate 120 (FIG. 1A) versus a radius of the substrate 120. The graph 306 is plotted to illustrate that various sputtering rates are achieved using a combination of power levels from the x1 kHz RF generator and the x MHz RF generator. For example, a plot 310A is plotted when the x1 kHz RF generator is operated to generate an RF signal having a power level of 0 watts, e.g., between 0 and 10 watts, etc., and the x MHz RF generator is operated to generate an RF signal having a power level of 5000 watts. As another example, a plot 310B is plotted when the x MHz RF generator is operated to generate an RF signal having a power level of 2500 watts and the x1 kHz RF generator is operated to generate an RF signal having a power level of 2500 watts. As yet another example, a plot 310C is plotted when the x MHz RF generator is operated to generate an RF signal having a power level of 0 watts, e.g., between 0 and 10 watts, etc., and the x1 kHz RF generator is operated to generate an RF signal having a power level of 5000 watts.

It should be noted that as an example, as a power level of an RF signal that is generated by the x1 kHz RF generator increases, there is an increase in a rate of increase in sputtering rate at the edge region and as the power level decreases, there is a decrease in the rate of increase in sputtering rate at the edge region. It should further be noted that as an example, as a power level of an RF signal that is generated by the x1 kHz RF generator increases, there is an increase in sputtering rate at the edge region and as the power level decreases, there is a decrease in the sputtering rate at the edge region. It should be further noted that as an example, as a power level of an RF signal that is generated by the x MHz RF generator increases, there is an increase in sputtering rate at the center region and as the power level decreases, there is a decrease in the sputtering rate at the center region. It should be noted that as an example, for the same amount of change in a power level of an RF signal that is generated by the x1 kHz RF generator and a power level of an RF signal that is generated by the x MHz RF generator, there is a greater amount of change in sputtering rate at the edge region attributable to the x1 kHz RF generator than an amount of change in the sputtering rate at the edge region attributable to the x MHz RF generator.

In one embodiment, instead of using the x MHz RF generator, the y MHz RF generator or a combination of the x and y MHz RF generators is used to control a sputtering rate at the center region of the plasma chamber 110.

Figure 3C:
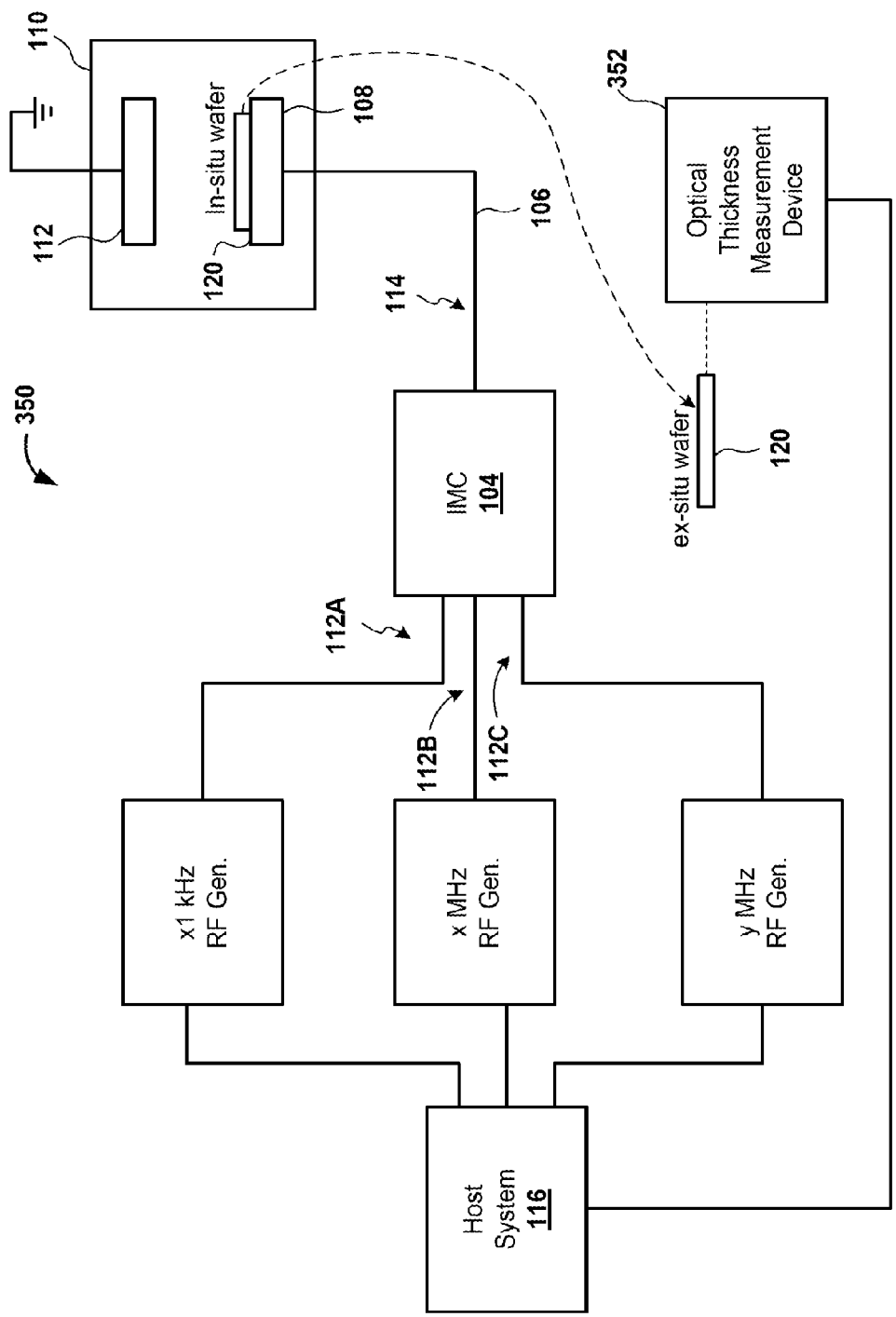
FIG. 3C is a diagram of a plasma system for controlling removal rates, in accordance with an embodiment described in the present disclosure.

FIG. 3C is a diagram of an embodiment of a plasma system 350 for controlling removal rates. The system 350 is similar to the plasma system 100 except that the system 350 includes an optical thickness measurement device (OTMD) 352, e.g., an interferometer, etc., that is used to measure a thickness of the substrate 120 ex situ, e.g., when the substrate 120 is taken out of the plasma chamber 110. The substrate 120 is removed from the cavity of the plasma chamber 110 to measure a thickness of the substrate 120. The OTMD 352 measures a thickness of the substrate 120 and provides the thickness to the host system 116. A processor of the host system 116 calculates based on the thickness and an amount of time passed since the substrate 120 is subjected to a removal operation, e.g., an etching operation, a sputtering operation, etc., in the plasma chamber 110, a removal rate of removing a material, e.g., oxide layer, mask layer, etc., that is deposited on the substrate 120. Examples of a processor include a microprocessor, a microcontroller, a CPU, an ASIC, a PLD, etc.

The processor of the host system 116 compares the calculated etch removal to a pre-determined removal rate. Upon determining that the calculated removal rate is not within a pre-determined threshold of the pre-determined removal rate, the processor of the host system 116 identifies from a memory device of the host system 116, a power level for each of the x1 kHz, the x MHz, and the y MHz RF generators to achieve the pre-determined removal rate. Examples of a memory device include a read-only memory (ROM), a random access memory (RAM), a hard disk, a volatile memory, a non-volatile memory, a redundant array of storage disks, a Flash memory, etc. The power levels are provided to DSPs of the corresponding x1 kHz, the x MHz, and the y MHz RF generators. Each of the x1 kHz, the x MHz, and the y MHz RF generators generates an RF signal having the corresponding power level and supplies the RF signal via the corresponding RF cable to a corresponding input of the IMC 104, which performs the operations described herein, and provides the modified RF signal 114 to the chuck 108.

The operations of measuring thickness of the substrate 120, calculating a removal rate from the measured thickness, and changing one or more power levels of corresponding one or more of the x1 kHz, the x MHz, and the y MHz RF generators are repeated until a removal rate within the pre-determined threshold from the pre-determined removal rate is achieved.

In case the measured thickness is within the pre-determined threshold of the pre-determined thickness, the processor of the host system 116 does not provide one or more power levels to the corresponding one or more of the x1 kHz, x MHz, and y MHz RF generators or continues to provide to the corresponding one or more of the x1 kHz, x MHz, and y MHz RF generators the same power levels provided in a previous clock cycle in which the measured thickness is within the pre-determined threshold of the pre-determined thickness.

Figure 4A:
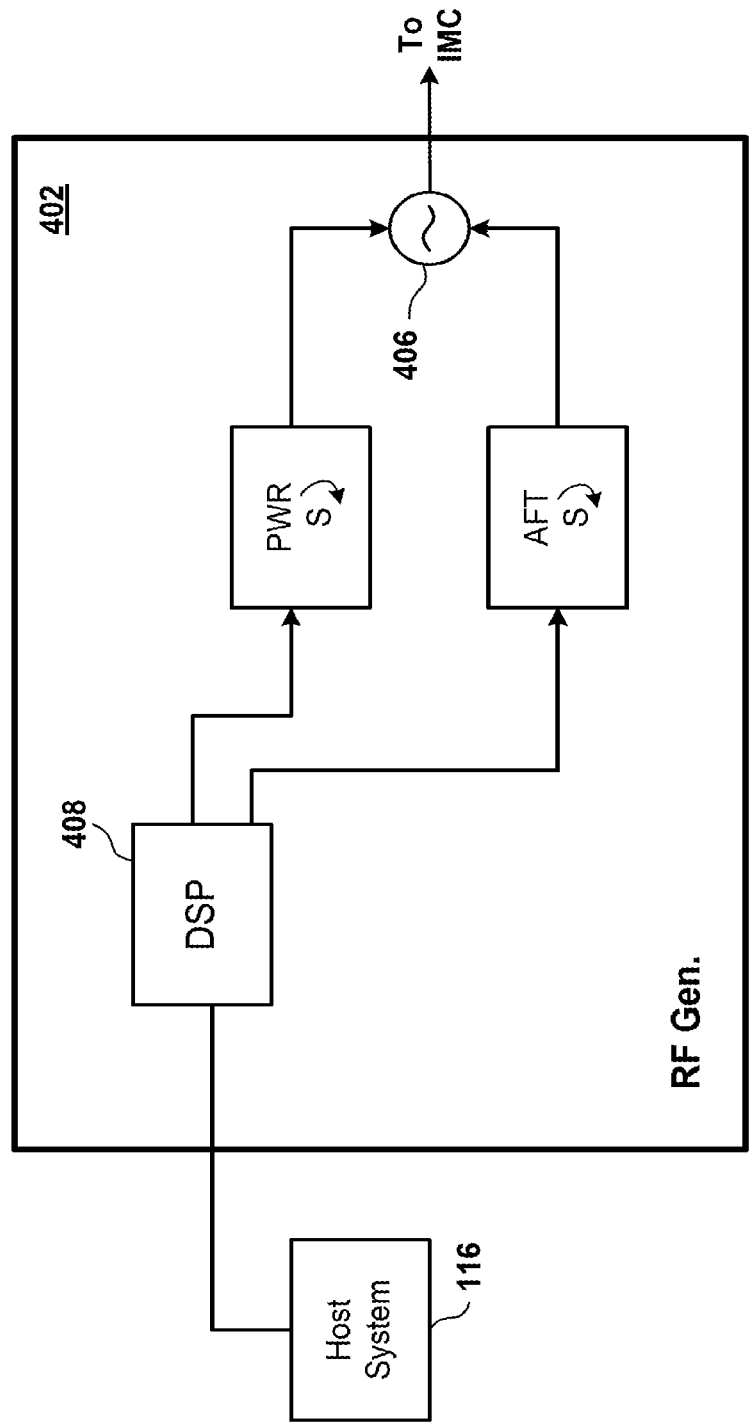
FIG. 4A is a diagram of an RF generator that is operated in a single state, in accordance with an embodiment described in the present disclosure.

FIG. 4A is a diagram of an embodiment of an RF generator 402 that is operated in a single state, e.g., a state S, etc. The RF generator 402 includes a DSP 408, a power controller PWRS, and an auto-frequency tuner (AFT) AFTS. The RF generator 402 is an example of any of the x1 kHz RF generator, the x MHz RF generator, and the y MHz RF generator. The processor of the host system 116 provides a power level via a communication device of the host system 116 and a communication device of the RF generator 402 to the DSP 408 of the host system 116. A communication device facilitates communication of parallel communication of data, or serial communication of data, or a combination thereof. The DSP 408 receives the power level for the state S, and identifies that the power level is associated with the state S.

The DSP 408 sends the power level to the power controller PWRS of the RF generator 402. The power controller PWRS drives, e.g., via a transistor, one or more transistors, etc., an RF power supply 406 of the RF generator 402. The RF power supply 406 is driven during the state S to generate an RF continuous wave signal, which is sent via an RF cable connected to an output of the RF generator 402 to the IMC 104 (FIG. 1A). The continuous wave signal has a power level and does not have multiple power levels.

Figure 4B:
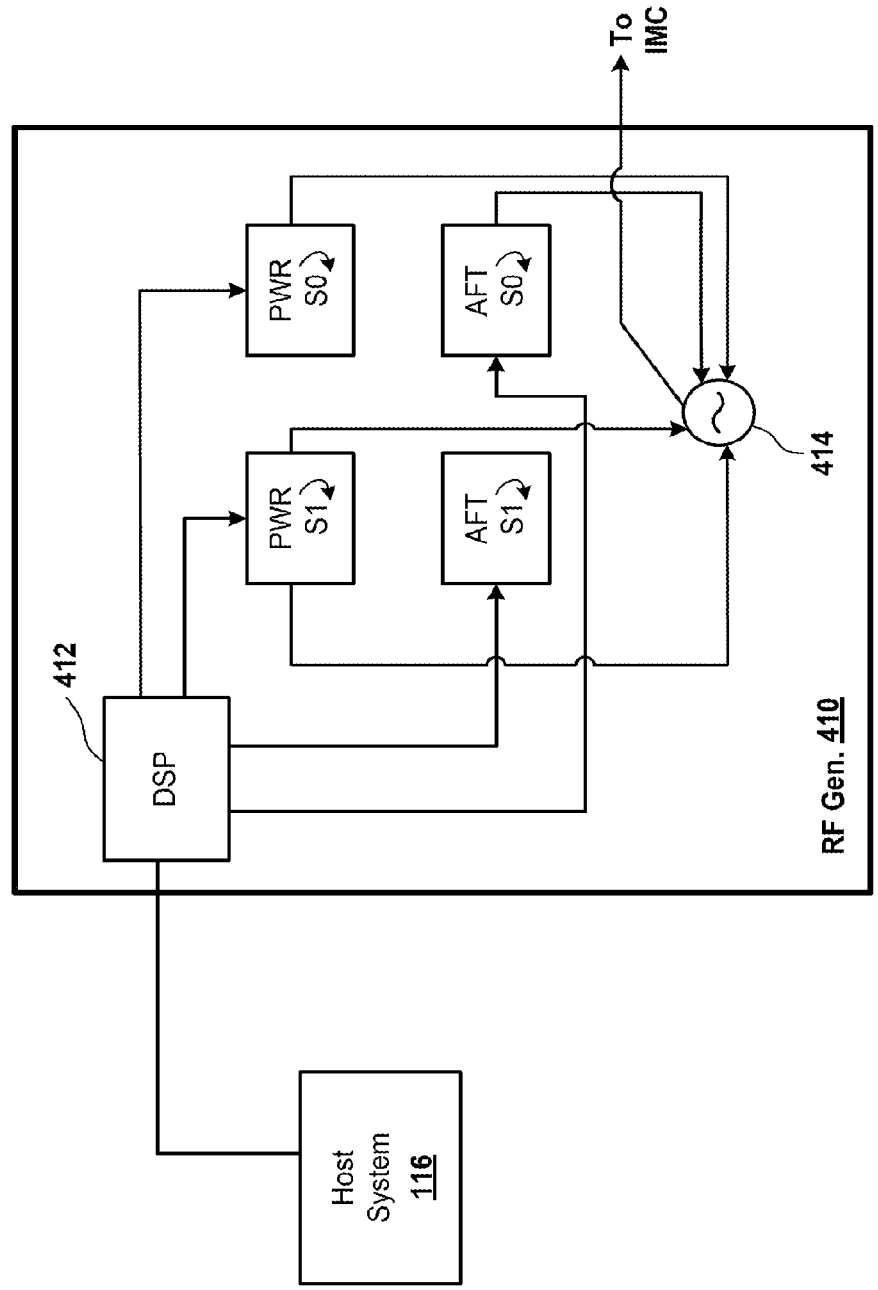
FIG. 4B is a diagram of an RF generator that is operated in multiple states, in accordance with an embodiment described in the present disclosure.

FIG. 4B is a diagram of an embodiment of an RF generator 410 that is operated in multiple states, e.g., a state S1, a state S0, etc. The RF generator 410 includes a DSP 412, a power controller PWRS1 for the state S1, a power controller PWRS0 for the state S0, an auto-frequency tuner AFTS1 for the state S1, and an auto-frequency tuner AFTS0 for the state S0. The RF generator 410 is an example of any of the x1 kHz RF generator, the x MHz RF generator, and the y MHz RF generator. The processor of the host system 116 provides power levels and timings for the states S1 and S0 via the communication device of the host system 116 and the communication device of the RF generator 410 to the DSP 412.

The DSP 412 receives the power levels and timings for the states S1 and S0 from the communication device of the RF generator 410, and identifies a power level and timings for the state S0 and a power level and timings for the state S1. For example, the DSP 412 distinguishes the power level and timings for the state S0 from the power level and timings for the state S1.

The DSP 412 sends the power level and timings for the state S1 to a power controller PWRS1 of the RF generator 410 and sends the power level and timings for the state S0 to a power controller PWRS0 of the RF generator 410. Each power controller PWRS1 and PWRS0 drives, e.g., via a transistor, one or more transistors, etc., an RF power supply 414 of the RF generator 410. For example, the power controller PWRS1 drives the RF power supply 410 during the state S1 by providing the power level and timings for the state S1 to the RF power supply 410, and the power controller PWRS0 drives the RF power supply 410 during the state S0 by providing the power level and timings for the state S0 to the RF power supply 410. The RF power supply 410 is driven during the states S1 and S0 to generate an RF pulse signal that switches between the states S1 and S0, e.g., between the two power levels, etc. The RF pulse signal is sent via an RF cable that is connected to an output of the RF generator 410 to the IMC 104 (FIG. 1A).

In one embodiment, all power amounts included in a power level for the state S0 are lower than power amounts included in a power level of the state S1. For example, the state S1 is a high state and the state S0 is a low state. As another example, the state S1 is a state 1 and the state S0 is a state 0.

In one embodiment, the RF generator 410 is modified to operate is more than two states, e.g., three states, four states, etc.

Figure 5A:
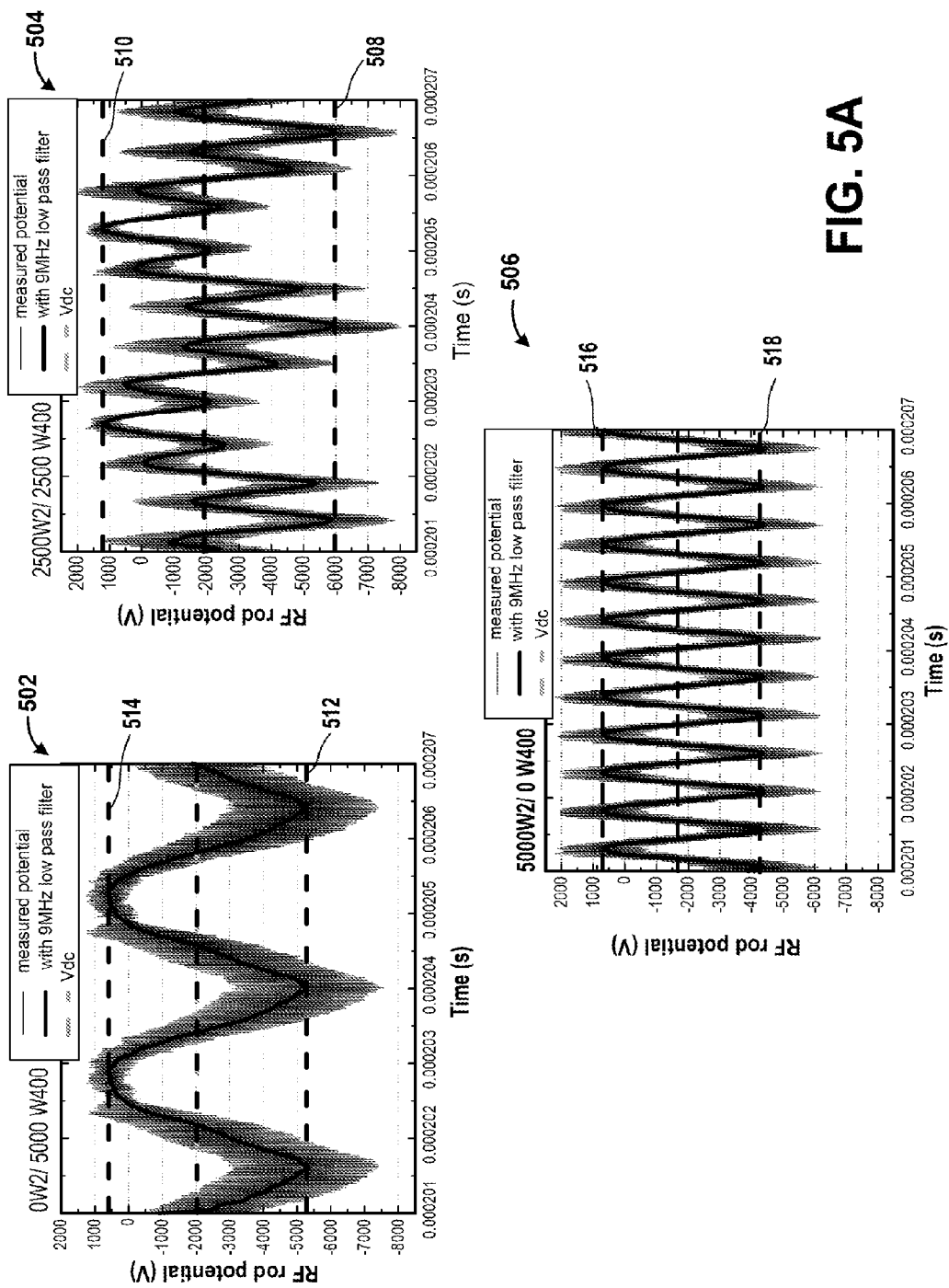
FIG. 5A shows graphs to illustrate that power levels of the kHz RF generator and the low frequency MHz RF generator are varied to achieve an RF rod potential that is usually not achieved when the power levels are at one end or at another end of a range of power levels, in accordance with an embodiment described in the present disclosure.

FIG. 5A is an embodiment of graphs 502, 504, and 506 to illustrate that power levels of the x1 kHz RF generator and the x MHz RF generator are varied to achieve an RF rod potential that is usually not achieved when the power levels are at one end or at another end of a range of power levels. An RF rod potential is a voltage that is measured at a point along the RF rod of the RF transmission line 106 (FIG. 1A).

Each graph 502, 504, and 506 plots an RF rod potential versus time. When the x1 kHz RF generator is operated to generate an RF signal having a power level of 5000 watts that is be sent via the circuit 202A (FIG. 2A) and the x MHz RF generator is operated to generate an RF signal having a power level of 0 watts, e.g., between 0 and 10 watts, etc., that is be sent via the circuit 202B (FIG. 2A), a maximum level 514 of RF rod potential is achieved and a minimum level 512 of RF rod potential is achieved. Moreover, when the x1 kHz RF generator is operated to generate an RF signal having a power level of 0 watts, e.g., between 0 and 10 watts, etc., that is sent via the circuit 202A and the x MHz RF generator is operated to generate an RF signal having a power level of 5000 watts that is sent via the circuit 202B, a maximum level 516 of RF rod potential is achieved and a minimum level 518 of RF rod potential is achieved. Also, when the x1 kHz RF generator is operated to generate an RF signal having a power level of 2500 watts that is sent via the circuit 202A and the x MHz RF generator is operated to generate an RF signal having a power level of 2500 watts that is sent via the circuit 202B, a minimum level 508 of RF rod potential is achieved and a maximum level 510 of RF rod potential is achieved.

The maximum level 510 is greater than the maximum level 514 and the maximum level 516. Moreover, the minimum level 508 is less than the minimum level 512 and the minimum level 518. By controlling the power level of the x1 kHz RF generator and the power level of the x MHz RF generator to be 2500 watts, e.g., between 2490 and 2510 watts, etc., an RF rod potential level that is less than another RF rod potential level achieved. The other RF rod potential level is achieved by controlling the x1 kHz RF generator to have the power level of 0 watts or 5000 watts and by controlling the x MHz RF generator to have the power level of 0 watts or 5000 watts.

It should be noted that the variation in the minimum and maximum RF rod potential levels is achieved when the chuck 108 is provided the modified RF signal 114 via the IMC 104. The modified RF signal 114 is generated by the IMC 104 in a manner described herein from RF signals that are received from the x1 kHZ RF generator and the x MHz RF generator.

In one embodiment, instead of using the x MHz RF generator, the y MHz RF generator or a combination of the x and y MHz RF generators is used to control an RF rod potential of the RF rod.

Figure 5B:
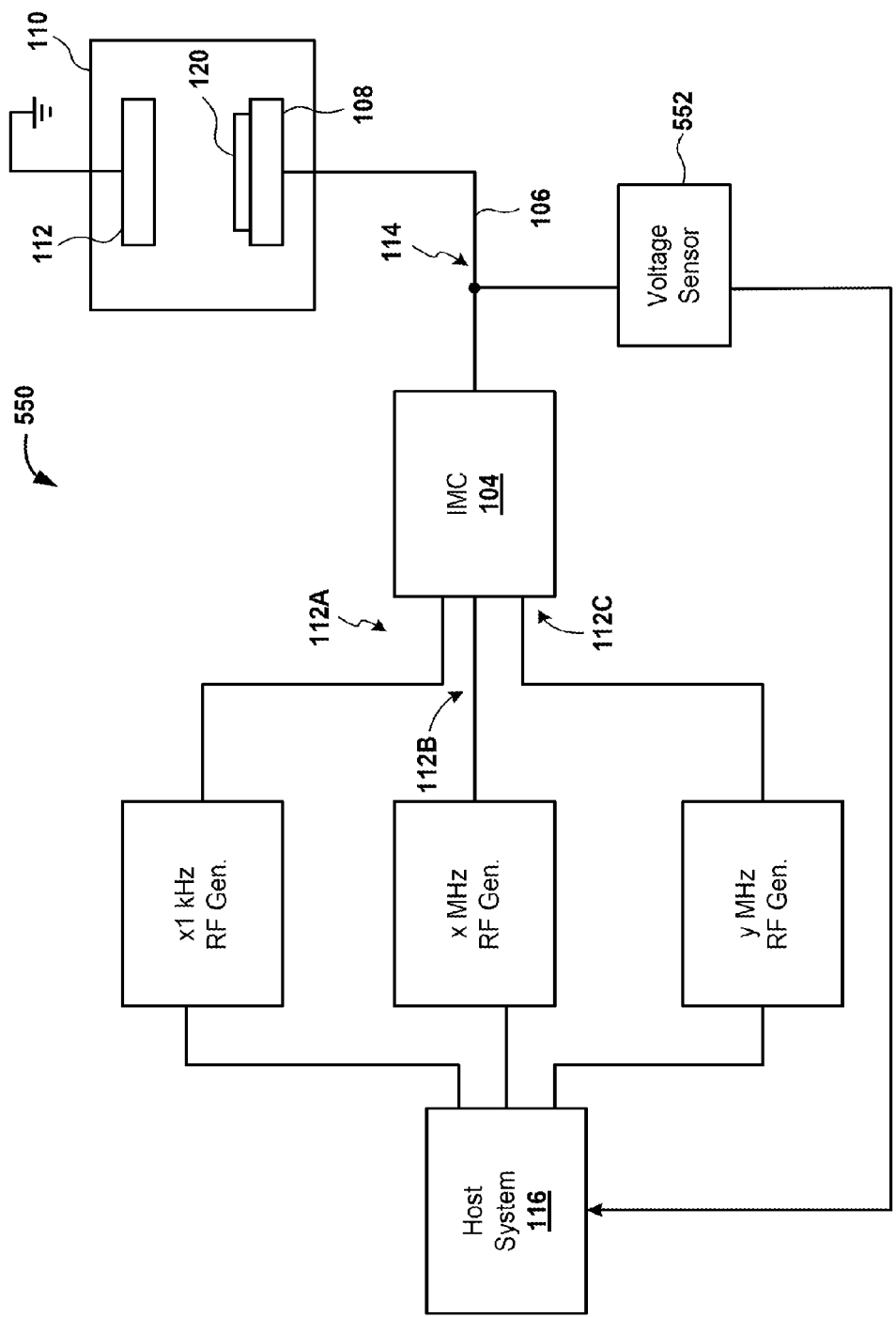
FIG. 5B is a diagram of a plasma system to illustrate use of an RF rod potential to vary power levels of one or more of the kHz RF generator, the low frequency MHz RF generator, and a high frequency MHz RF generator, in accordance with an embodiment described in the present disclosure.

FIG. 5B is a diagram of an embodiment of a plasma system 550 to illustrate use of an RF rod potential to vary power levels of one or more of the x1 kHz, the x MHz, and the y MHz RF generators. The plasma system 550 is similar to the plasma system 100 (FIG. 1A) except that the plasma system 550 includes a voltage sensor 552 that measures an RF rod potential. The voltage sensor 552 is connected to the RF rod of the RF transmission line 106.

When the substrate 120 is being processed, e.g., etched, sputtered, deposited with monomers or polymers, etc., within the plasma chamber 110, the voltage sensor 552 measures an RF rod potential at a point on the RF rod. The measured RF rod potential is provided by the voltage sensor 552 to the processor of the host system 116. The processor of the host system 116 compares the measured RF rod potential to a pre-determined rod potential to determine whether the measured RF rod potential is within a pre-determined threshold of the pre-determined rod potential.

Upon determining that the measured RF rod potential is not within the pre-determined threshold of the pre-determined rod potential, the processor of the host system 116 identifies one or more power levels of corresponding one or more of the x1 kHz, x MHz, and y MHz RF generators from the memory device of the host system 116. The one or more power levels correspond, e.g., are mapped to, are linked with, etc., the pre-determined rod potential within the memory device. The one or more power levels of the corresponding one or more of the x1 kHz, x MHz, and y MHz RF generators are provided to the corresponding one or more of the x1 kHz, x MHz, and y MHz RF generators. Upon receiving the corresponding one or more power levels, the corresponding one or more of the x1 kHz, x MHz, and y MHz RF generators generate corresponding one or more RF signals to provide via corresponding one or more RF cables 112A, 112B, and 112C to the IMC 104. The IMC 104 generates the modified RF signal 114 in a manner described herein from the one or more RF signals received from the corresponding one or more x1 kHz, x MHz, and y MHz RF generators and provides the modified RF signal 114 to the chuck 108 to generate or maintain plasma within the plasma chamber 110.

The operations of measuring an RF rod potential, determining whether the measured RF rod potential is within the pre-determined threshold of the pre-determined RF rod potential, and identifying one or more power levels of corresponding one or more of the x1 kHz, x MHz, and y MHz RF generators are iteratively performed until the measured RF rod potential is within the pre-determined threshold of the pre-determined RF rod potential.

In case the measured RF rod potential is within the pre-determined threshold of the pre-determined RF rod potential, the processor of the host system 116 does not provide one or more power levels to the corresponding one or more of the x1 kHz, x MHz, and y MHz RF generators or continues to provide to the corresponding one or more of the x1 kHz, x MHz, and y MHz RF generators the same power levels provided in a previous clock cycle in which the measured RF rod potential is within the pre-determined threshold of the pre-determined RF rod potential.

Figure 6A:
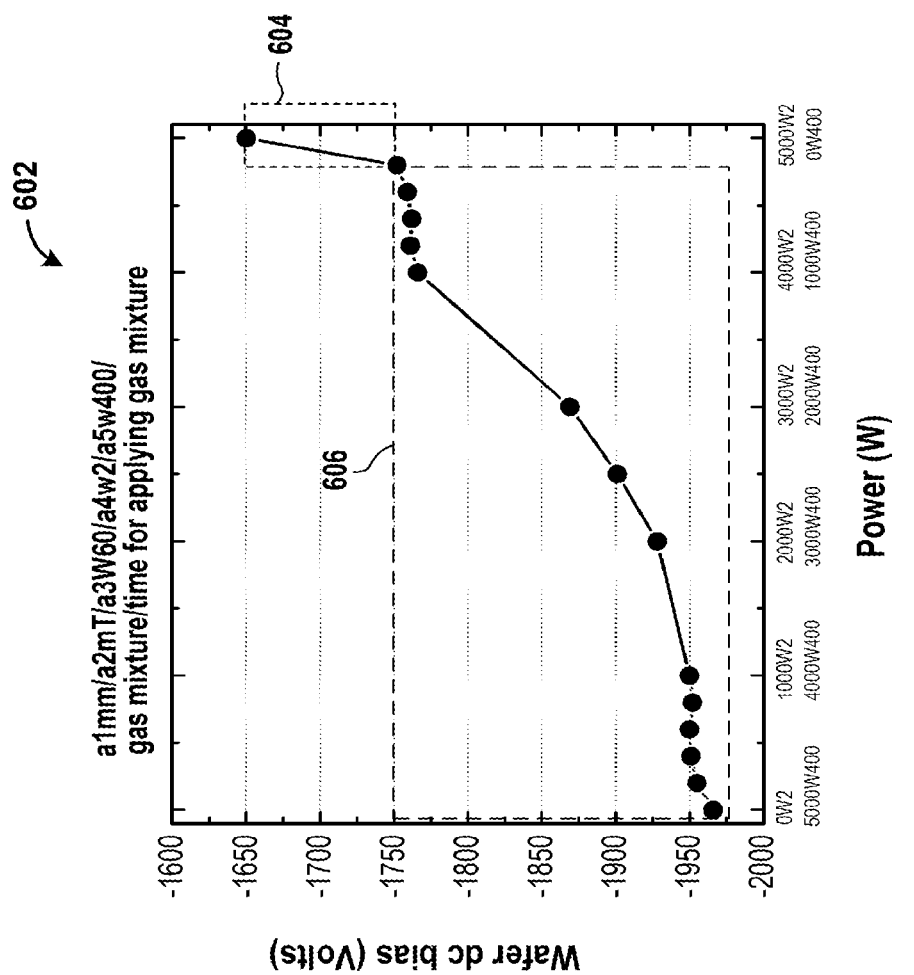
FIG. 6A is a graph to illustrate a plot of wafer direct current (DC) bias voltage versus power levels of RF signals supplied by the kHz and low frequency RF generators, in accordance with an embodiment described in the present disclosure.

FIG. 6A is an embodiment of a graph 602 to illustrate a plot of wafer direct current (DC) bias voltage versus power levels of RF signals supplied by the x1 kHz and x MHz RF generators. When an RF signal having a power level within a minimum power level range, e.g., 0-300 watts, 0-400 watts, etc., is generated by the x1 kHz RF generator and sent via the circuit 202A (FIG. 1A) and an RF signal having a power level within a maximum power level range, e.g., 4700-5000 watts, 4600-5000 watts, etc., is generated by the x MHz RF generator and sent via the circuit 202B, a rate of increase in wafer DC bias voltage increases. The rate of increase in the wafer DC bias voltage increases compared to a rate of increase in the wafer DC bias voltage when an RF signal having a power level within the remaining power level range, e.g., 300-5000 watts, 400-5000 watts, etc., is generated by the x1 kHz RF generator and sent via the circuit 202A (FIG. 1A) and an RF signal having a power level within the remaining power level range, e.g., 0-4600 watts, 0-4700 watts, etc., is generated by the x MHz RF generator. As shown in FIG. 6A, the rate of increase of the wafer DC bias voltage in a region 604 of the graph 602 is greater than a rate of increase of the wafer DC bias voltage in a region 606 of the graph 602.

It should be noted that a total range of power levels of an RF signal that is generated by the x1 kHz RF generator is a sum of the minimum power level range and the remaining power level range of the RF signal. Similarly, a total range of power levels of an RF signal that is generated by the x MHz RF generator is a sum of the maximum power level range and the remaining power level range of the RF signal.

In one embodiment, instead of using the x MHz RF generator, the y MHz RF generator or a combination of the x and y MHz RF generators is used to control a wafer DC bias voltage within the plasma chamber 110.

Figure 6B:
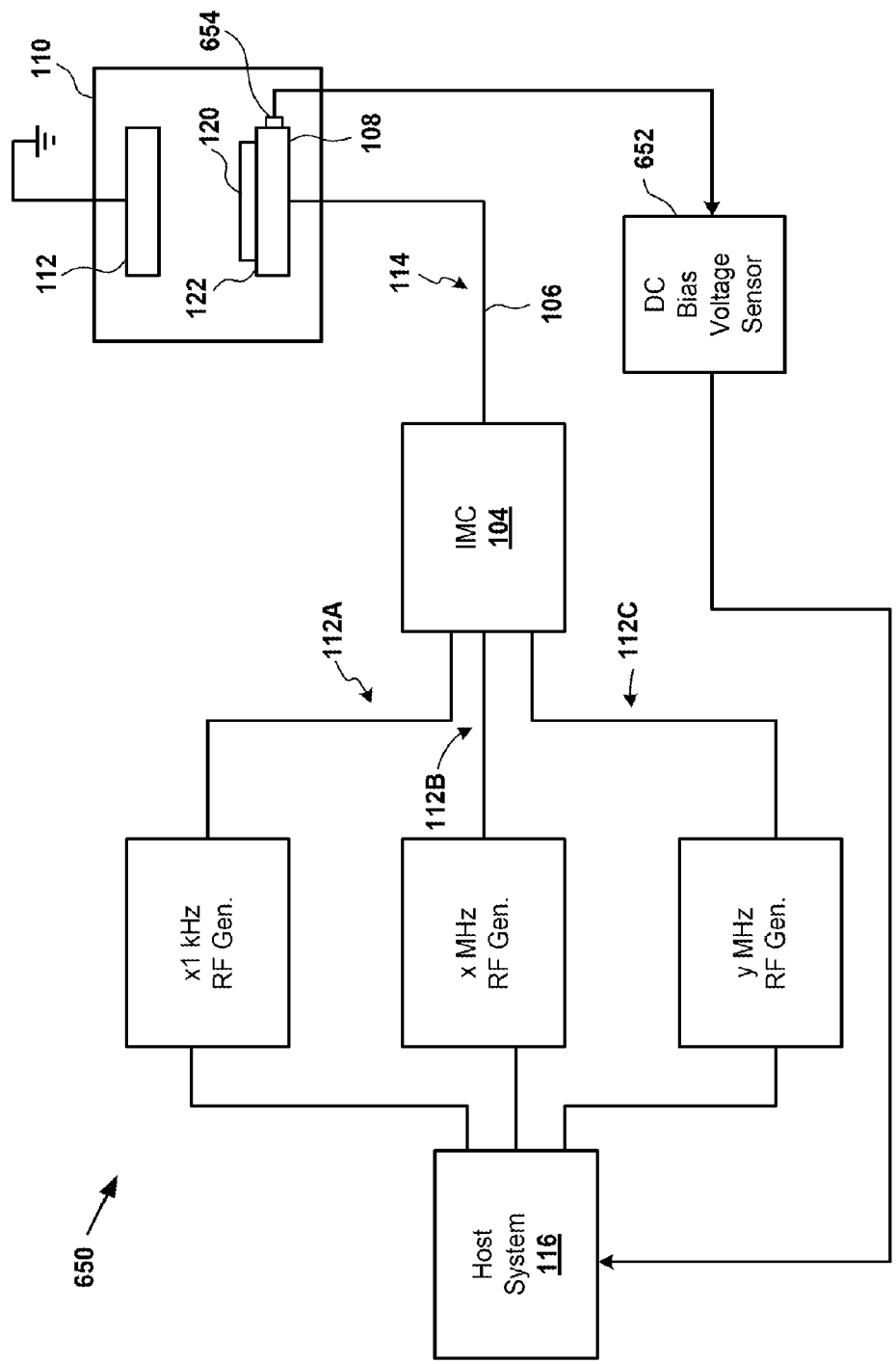
FIG. 6B is a block diagram of a plasma system to illustrate use of a DC bias voltage sensor and an electrode to measure DC bias voltage at the substrate placed on top of a chuck to control power levels of one or more of the kHz RF generator, the low frequency MHz RF generator, and the high frequency MHz RF generator, in accordance with an embodiment described in the present disclosure.

FIG. 6B is a block diagram of an embodiment of a plasma system 650 to illustrate use of a DC bias voltage sensor 652 and an electrode 654, e.g., a DC voltage pickup pin, etc., to measure DC bias voltage of the substrate 120 at the chuck 108. The electrode 654 is attached, e.g., soldered, etc., to a side surface of the chuck 108. The electrode 654 is connected to the DC bias voltage sensor 652. The top surface 122 is charged by the substrate 120, which is DC biased when plasma is generated and/or maintained in the plasma chamber 110.

The electrode 654 captures an electrical signal from the chuck 108 when the substrate 120 is DC biased. The electrical signal is representative of an amount of the wafer DC bias voltage. The DC bias voltage sensor 652 receives the electrical signal and generates a measured value of the wafer DC bias voltage, which is provided by the DC bias voltage sensor 652 to the processor of the host system 116.

The processor of the host system 116 determines whether the measured DC bias voltage is within a pre-determined threshold of a pre-determined DC bias voltage. Upon determining that the measured DC bias voltage is not within the pre-determined threshold of the pre-determined DC bias voltage, the processor of the host system 116 identifies one or more power levels of corresponding one or more of the x1 kHz, x MHz, and y MHz RF generators from the memory device of the host system 116. The one or more power levels correspond, e.g., are mapped to, are linked with, etc., the pre-determined DC bias voltage within the memory device. The one or more power levels of the corresponding one or more of the x1 kHz, x MHz, and y MHz RF generators are provided to the corresponding one or more of the x1 kHz, x MHz, and y MHz RF generators. Upon receiving the corresponding one or more power levels, the corresponding one or more of the x1 kHz, x MHz, and y MHz RF generators generate corresponding one or more RF signals to provide via corresponding one or more RF cables 112A, 112B, and 112C to the IMC 104. The IMC 104 generates the modified RF signal 114 in a manner described herein from the one or more RF signals received from the corresponding one or more x1 kHz, x MHz, and y MHz RF generators and provides the modified RF signal 114 to the chuck 108 to generate or maintain plasma within the plasma chamber 110.

The operations of measuring a wafer DC bias voltage, determining whether the measured DC bias voltage is within the pre-determined threshold of the pre-determined DC bias voltage, and identifying one or more power levels of corresponding one or more of the x1 kHz, x MHz, and y MHz RF generators are iteratively performed until the measured DC bias voltage is within the pre-determined threshold of the pre-determined DC bias voltage.

In case the measured DC bias voltage is within the pre-determined threshold of the pre-determined DC bias voltage, the processor of the host system 116 does not provide one or more power levels to the corresponding one or more of the x1 kHz, x MHz, and y MHz RF generators or continues to provide to the corresponding one or more of the x1 kHz, x MHz, and y MHz RF generators the same power levels provided in a previous clock cycle in which the measured DC bias voltage is within the pre-determined threshold of the pre-determined DC bias voltage.

In one embodiment, the electrode 654 is attached to the top surface 122 or to a bottom surface of the chuck 108.

Figure 7A:
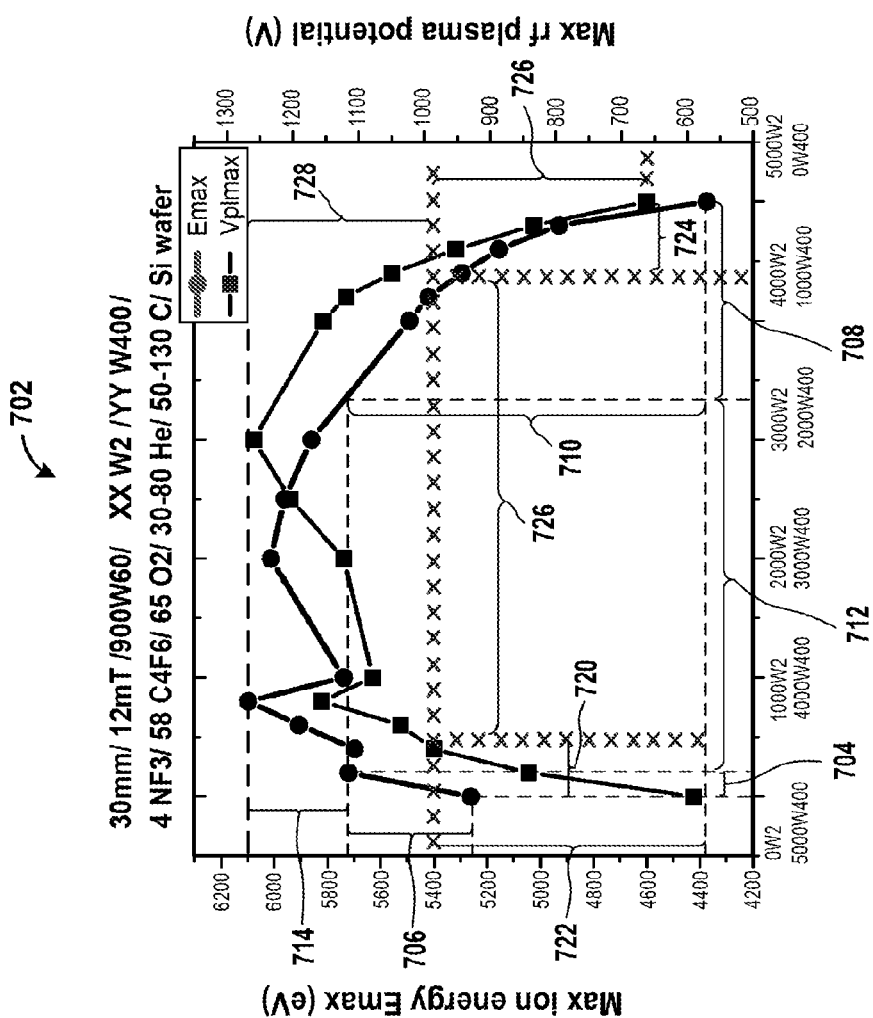
FIG. 7A is a graph that plots maximum ion energy and maximum RF plasma potential versus power levels of RF signals that are generated by the kHz and low frequency MHz RF generators, in accordance with an embodiment described in the present disclosure.

FIG. 7A is an embodiment of a graph 702 that plots maximum ion energy versus power levels of RF signals that are generated by the x1 kHz and x MHz RF generators. The graph 702 also plots maximum RF plasma potential versus power levels of RF signals that are generated by the x1 kHz and x MHz RF generators.

When an RF signal having a power level within a maximum power level range, e.g., 4800-5000 watts, etc., that lies in a region 704 is supplied by the x1 kHz RF generator and is sent via the circuit 202A (FIG. 2A) and an RF signal having a power level within a minimum power level range that lies in the region 704 is supplied by the x MHz RF generator and is sent via the circuit 202B (FIG. 2A), a first minimum level in a region 706 of maximum achievable ion energy, measured in electron volts (eV), is generated within the plasma chamber 110 (FIG. 1A). Similarly, when an RF signal having a power level within a minimum power level range that lies in a region 708 is supplied by the x1 kHz RF generator and is sent via the circuit 202A (FIG. 2A) and an RF signal having a power level within a maximum power level range that lies in the region 708 is supplied by the x MHz RF generator and is sent via the circuit 202B (FIG. 2A), a second minimum level in a region 710 of maximum achievable ion energy is generated within the plasma chamber 110.

Moreover, when an RF signal having a power level within a mid power level range that lies in a region 712 is supplied by the x1 kHz RF generator and is sent via the circuit 202A (FIG. 2A) and an RF signal having a power level within a mid power level range that lies in the region 712 is supplied by the x MHz RF generator and is sent via the circuit 202B (FIG. 2A), a maximum level in a region 714 of maximum achievable ion energy is generated within the plasma chamber 110. The maximum level of maximum achievable ion energy in the region 714 is greater than the first minimum level of the maximum achievable ion energy in the region 706 and the second minimum level of the maximum achievable ion energy in the region 708.

When an RF signal having a power level within a maximum power level range that lies in a region 720 is supplied by the x1 kHz RF generator and is sent via the circuit 202A (FIG. 2A) and an RF signal having a power level within a minimum power level range that lies in the region 720 is supplied by the x MHz RF generator and is sent via the circuit 202B (FIG. 2A), a first minimum level in a region 722 of maximum achievable RF plasma potential is generated within the plasma chamber 110 (FIG. 1A). Similarly, when an RF signal having a power level within a minimum power level range that lies in a region 724 is supplied by the x1 kHz RF generator and is sent via the circuit 202A (FIG. 2A) and an RF signal having a power level within a maximum power level range that lies in the region 724 is supplied by the x MHz RF generator and is sent via the circuit 202B (FIG. 2A), a second minimum level in a region 726 of maximum achievable RF plasma potential is generated within the plasma chamber 110.

Moreover, when an RF signal having a power level within a mid power level range that lies in a region 726 is supplied by the x1 kHz RF generator and is sent via the circuit 202A (FIG. 2A) and an RF signal having a power level within a mid power level range that lies in the region 726 is supplied by the x MHz RF generator and is sent via the circuit 202B (FIG. 2A), a maximum level in a region 728 of maximum achievable RF plasma potential is generated within the plasma chamber 110. The maximum level of maximum achievable RF plasma potential is greater than the first minimum level of the maximum achievable RF plasma potential and the second minimum level of the maximum achievable RF plasma potential.

In one embodiment, instead of using the x MHz RF generator, the y MHz RF generator or a combination of the x and y MHz RF generators is used to control a maximum achievable ion energy or a maximum achievable RF plasma potential within the plasma chamber 110.

Figure 7B:
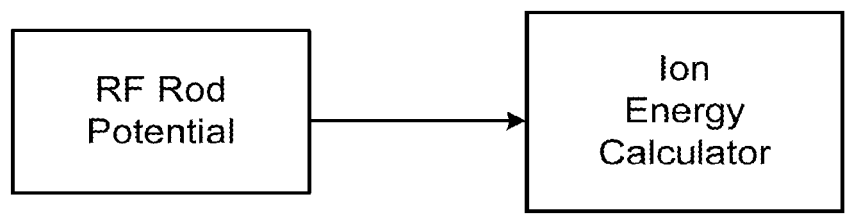
FIG. 7B is a block diagram to illustrate calculation of an amount of ion energy from an RF rod potential, in accordance with an embodiment described in the present disclosure.

FIG. 7B is a block diagram to illustrate calculation of an amount of ion energy from an RF rod potential. The amount of ion energy is calculated by an ion energy calculator, which is executed by the processor of the host system 116 (FIG. 1A). For example, the ion energy calculator calculates ion energy distribution function (IEDF), designated as f(E), from the RF rod potential and a wafer DC bias voltage $V_{dc}$ by applying an equation:

$$f(E) \equiv \left(\frac{dV_{LF}}{dt}\right)^{-1}, \quad (1)$$

where $$V_{LF}(t) = \left[\left(\frac{V_{LFRF(PEAK)} - V_{dc}}{2}\right)^{1/2} - \left(\frac{V_{LFRF(PEAK)} - V_{dc}}{8}\right)^{1/2} \sin\omega t\right]^2 \quad (2)$$

In equation (2), $V_{LFRF(PEAK)}$ is a peak value of a low frequency RF voltage $V_{LF}$ supplied to the plasma chamber 110 and calculated by the processor of the host system 116 from the RF rod potential, $V_{dc}$ is the wafer DC bias voltage that is measured in a manner described herein, t is time, and ω is a low frequency calculated by the processor of the host system 116. To illustrate, the frequency ω is calculated by filtering high frequencies from a voltage signal that is generated by the voltage sensor 552 (FIG. 5B) used to measure the RF rod potential. The filtering of the high frequencies is performed by the processor of the host system 116 or by a filter. In one embodiment, the peak value $V_{LFRF(PEAK)}$ is calculated by the processor of the host system 116 from voltages measured using a voltage sensor that is connected to the chuck 108.

The processor of the host system 116 determines whether the calculated ion energy is within a pre-determined threshold of a pre-determined ion energy. Upon determining that the calculated ion energy is not within the pre-determined threshold of the pre-determined ion energy, the processor of the host system 116 identifies one or more power levels of corresponding one or more of the x1 kHz, x MHz, and y MHz RF generators from the memory device of the host system 116. The one or more power levels correspond, e.g., are mapped to, are linked with, etc., the pre-determined ion energy within the memory device. The one or more power levels of the corresponding one or more of the x1 kHz, x MHz, and y MHz RF generators are provided to the corresponding one or more of the x1 kHz, x MHz, and y MHz RF generators. Upon receiving the corresponding one or more power levels, the corresponding one or more of the x1 kHz, x MHz, and y MHz RF generators generate corresponding one or more RF signals to provide via corresponding one or more RF cables 112A, 112B, and 112C to the IMC 104. The IMC 104 generates the modified RF signal 114 in a manner described herein from the one or more RF signals received from the corresponding one or more x1 kHz, x MHz, and y MHz RF generators and provides the modified RF signal 114 to the chuck 108 to generate or maintain plasma within the plasma chamber 110.

The operations of calculating the ion energy, determining whether the calculated ion energy is within the pre-determined threshold of the pre-determined ion energy, and identifying one or more power levels of corresponding one or more of the x1 kHz, x MHz, and y MHz RF generators are iteratively performed until the calculated ion energy is within the pre-determined threshold of the pre-determined ion energy.

In case the calculated ion energy is within the pre-determined threshold of the pre-determined ion energy, the processor of the host system 116 does not provide one or more power levels to the corresponding one or more of the x1 kHz, x MHz, and y MHz RF generators or continues to provide to the corresponding one or more of the x1 kHz, x MHz, and y MHz RF generators the same power levels provided in a previous clock cycle in which the calculated ion energy is within the pre-determined threshold of the pre-determined ion energy.

Figure 7C:
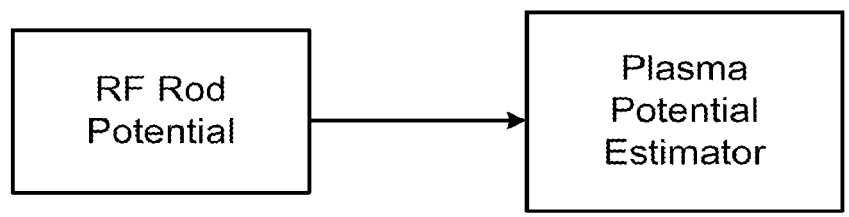
FIG. 7C is a block diagram to illustrate calculation of an amount of plasma potential from an RF rod potential, in accordance with an embodiment described in the present disclosure.

FIG. 7C is a block diagram to illustrate calculation of an amount of plasma potential from an RF rod potential. The amount of plasma potential is calculated by a plasma potential estimator, which is executed by the processor of the host system 116 (FIG. 1A). A relation between the plasma potential, which is voltage of plasma within the plasma chamber and the RF rod potential, which is measured in a manner described herein is stored in the memory device of the host system 116. For example, a difference between the plasma potential and the RF rod potential is stored in the memory device of the host system 116. The processor of the host system 116 calculates the plasma potential by applying the relation to the measured RF rod potential.

The processor of the host system 116 determines whether the calculated plasma potential is within a pre-determined threshold of a pre-determined plasma potential. Upon determining that the calculated plasma potential is not within the pre-determined threshold of the pre-determined plasma potential, the processor of the host system 116 identifies one or more power levels of corresponding one or more of the x1 kHz, x MHz, and y MHz RF generators from the memory device of the host system 116. The one or more power levels correspond, e.g., are mapped to, are linked with, etc., the pre-determined plasma potential within the memory device. The one or more power levels of the corresponding one or more of the x1 kHz, x MHz, and y MHz RF generators are provided to the corresponding one or more of the x1 kHz, x MHz, and y MHz RF generators. Upon receiving the corresponding one or more power levels, the corresponding one or more of the x1 kHz, x MHz, and y MHz RF generators generate corresponding one or more RF signals to provide via corresponding one or more RF cables 112A, 112B, and 112C to the IMC 104. The IMC 104 generates the modified RF signal 114 in a manner described herein from the one or more RF signals received from the corresponding one or more x1 kHz, x MHz, and y MHz RF generators and provides the modified RF signal 114 to the chuck 108 to generate or maintain plasma within the plasma chamber 110.

The operations of calculating the plasma potential, determining whether the calculated plasma potential is within the pre-determined threshold of the pre-determined plasma potential, and identifying one or more power levels of corresponding one or more of the x1 kHz, x MHz, and y MHz RF generators are iteratively performed until the calculated plasma potential is within the pre-determined threshold of the pre-determined plasma potential.

In case the calculated plasma potential is within the pre-determined threshold of the pre-determined plasma potential, the processor of the host system 116 does not provide one or more power levels to the corresponding one or more of the x1 kHz, x MHz, and y MHz RF generators or continues to provide to the corresponding one or more of the x1 kHz, x MHz, and y MHz RF generators the same power levels provided in a previous clock cycle in which the calculated plasma potential is within the pre-determined threshold of the pre-determined plasma potential.

Figure 8A:
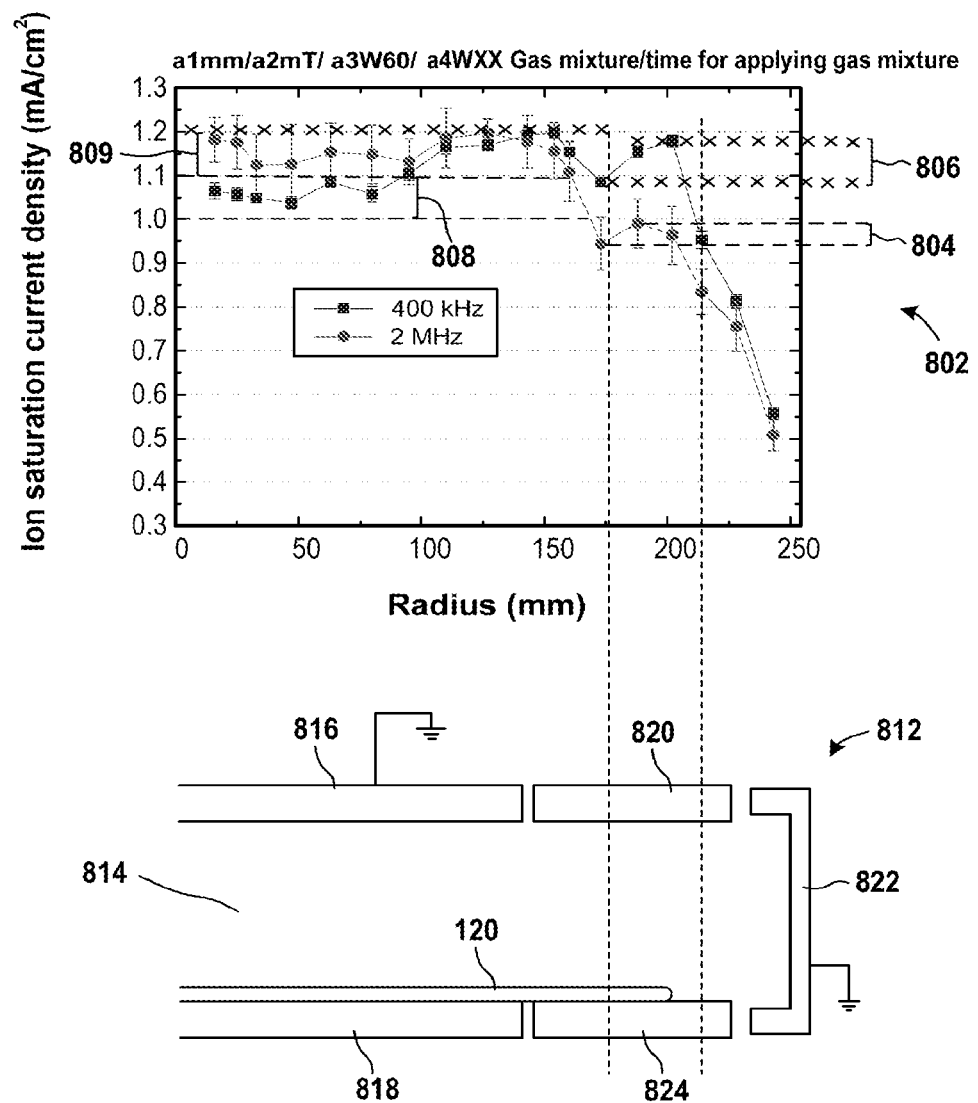
FIG. 8A is a diagram to illustrate a control of ion saturation current density in an edge region of a plasma chamber by using the kHz RF generator and a control of ion saturation current density in a center region of the plasma chamber by using the low frequency MHz RF generator or the high frequency MHz RF generator, in accordance with an embodiment described in the present disclosure.

FIG. 8A is a diagram to illustrate a control of ion saturation current density in an edge region 810 of a plasma chamber 812 by using the x1 kHz RF generator and a control of ion saturation current density in a center region 814 of the plasma chamber 812 by using the x MHz RF generator or the y MHz RF generator. The plasma chamber 812 is an example of the plasma chamber 110 (FIG. 1A).

The x1 kHz RF generator supplies an RF signal that is sent via the circuit 202A (FIG. 2A) of the impedance matching circuit 104 (FIG. 1A) to control an ion saturation current density at the edge region 810. For example, there is an increase in an ion saturation current density at the edge region 810 when a power level of an RF signal supplied by the x1 kHz RF generator is greater than a power level of an RF signal supplied by the x MHz RF generator compared to when a power level of an RF signal supplied by the x1 kHz RF generator is less than a power level of an RF signal supplied by the x MHz RF generator. As another example, when a power level of an RF signal supplied by the x1 kHz RF generator increases, there is an increase in an ion saturation current density at the edge region 810 and when a power level of an RF signal supplied by the x1 kHz RF generator decreases, there is a decrease in an ion saturation current density at the edge region 810. The RF signal supplied by the x1 kHz RF generator pushes plasma to the edge region 810 from the center region 814, and the push increases area ratio between the lower electrode and the upper electrode 112 (FIG. 1A) to increase ion energy density at the edge region 810. As yet another example, the circuit 202A transfers an RF signal that is generated by the x1 kHz RF generator to increase a first initial level 804 of ion saturation current density, measured in milliamperes/square centimeters, to an increased level 806 in the edge region 810. The levels 804 and 806 are shown in a graph 802, which plots an ion saturation current density versus radius of the substrate 120 (FIG. 1A). The first initial level 804 of ion saturation current density is achieved using an RF signal that is transferred via the circuit 202B and that is generated by the x MHz RF generator.

Similarly, the x MHz RF generator supplies an RF signal that is sent via the circuit 202B (FIG. 2A) of the impedance matching circuit 104 to control an ion saturation current density at the center region 814. For example, there is an increase in an ion saturation current density at the center region 814 when a power level of an RF signal supplied by the x MHz RF generator is greater than a power level of an RF signal supplied by the x1 kHz RF generator compared to when a power level of an RF signal supplied by the x MHz RF generator is less than a power level of an RF signal supplied by the x1 kHz RF generator. As another example, when a power level of an RF signal supplied by the x MHz RF generator increases, there is an increase in an ion saturation current density at the center region 814 and when a power level of an RF signal supplied by the x MHz RF generator decreases, there is a decrease in an ion saturation current density at the center region 814. As another example, the circuit 202B transfers an RF signal that is generated by the x MHz RF generator to increase a second initial level 808 to an increased level 809 of ion saturation current density in the center region 814. The second initial level 808 of ion saturation current density in the center region 814 is achieved using an RF signal that is transferred via the circuit 202A and that is generated by the x1 kHz RF generator.

In one embodiment, the center region 814 is located under an upper electrode 816 of the plasma chamber 812 and over a lower electrode 818 of the plasma chamber 812. For example, the center region 814 is located between the upper electrode 816 and the lower electrode 818.

In one embodiment, the center region 814 is further away from a C-shroud 822 compared to the edge region 810. For example, the center region 814 is not under an upper edge electrode 820 that surrounds the upper electrode 816. It should be noted that in one embodiment, the upper edge electrode 820 and the upper electrode 816 are separated by a dielectric ring (not shown).

In an embodiment, the edge region 810 is not located under the upper electrode 816 of the plasma chamber 812 and not located over the lower electrode 818 of the plasma chamber 812. For example, the edge region 810 is not located between the upper electrode 816 and the lower electrode 818.

In one embodiment, the edge region 810 is closer to the C-shroud 822 compared to the center region 814. For example, the edge region 810 is under the upper edge electrode 820.

In one embodiment, instead of using the x MHz RF generator, the y MHz RF generator or a combination of the x and y MHz RF generators is used to control an ion saturation current density of ions within the plasma chamber 812.

It should further be noted that as plasma is pushed to the edge region 810, there in an increase in RF coupling at the edge region 810, and the increase in the RF coupling increases an amount of negative wafer DC bias voltage in the plasma chamber 812.

In an embodiment, the lower electrode 818 is surrounded by a lower edge electrode 824. It should be noted that in one embodiment, the lower electrode 818 and the lower edge electrode 824 are separated by a dielectric ring (not shown).

FIG. 8B is a block diagram of an embodiment of a plasma system 850 for measurement of ion saturation current density. The plasma system 850 is an example of the plasma system 100 (FIG. 1A). The plasma system 850 is similar to the plasma system 100 except that the plasma system 850 includes a probe 852, e.g., a planar ion flux probe, a Langmuir probe, etc., and a current sensor 854 that is connected to the probe 852. The current sensor 854 is also coupled to the host system 116.

The probe 852 is immersed in plasma between electrodes 112 and 122. The probe 852 has a surface area, e.g., measured in square centimeters, etc., and is rotated within the plasma chamber 110. The probe 852 when rotates collects ion current within the plasma chamber 110 over the surface area of the probe 852 to generate electrical signals and provides the electrical signals to the current sensor 854.

The current sensor 854 measures an amount of current from the electrical signals and provides the amount of current to the processor of the host system 116. The processor of the host system 116 calculates the amount of current per unit surface area of the probe 852 to calculate the ion saturation current density.

The processor of the host system 116 compares the calculated ion saturation current density to a pre-determined ion saturation current density. Upon determining that the calculated ion saturation current density is not within a pre-determined threshold of the pre-determined ion saturation current density, the processor of the host system 116 identifies from the memory device of the host system 116, a power level for each of the x1 kHz, the x MHz, and the y MHz RF generators to achieve the pre-determined ion saturation current density. The power levels are provided to the DSPs of the corresponding x1 kHz, the x MHz, and the y MHz RF generators. Each of the x1 kHz, the x MHz, and the y MHz RF generators generates an RF signal having the corresponding power level and supplies the RF signal via the corresponding RF cable to a corresponding input of the IMC 104, which performs the operations described herein, and provides the modified RF signal 114 to the chuck 108.

The operations of calculating the ion saturation current density, comparing the calculated ion saturation current density with the pre-determined ion saturation current density, and changing one or more power levels of corresponding one or more of the x1 kHz, the x MHz, and the y MHz RF generators are repeated until a calculated ion saturation current density is within the pre-determined threshold from the pre-determined ion saturation current density.

In case the calculated ion saturation current density is within the pre-determined threshold of the pre-determined ion saturation current density, the processor of the host system 116 does not provide one or more power levels to the corresponding one or more of the x1 kHz, x MHz, and y MHz RF generators or continues to provide to the corresponding one or more of the x1 kHz, x MHz, and y MHz RF generators the same power levels provided in a previous clock cycle in which the calculated ion saturation current density is within the pre-determined threshold of the pre-determined ion saturation current density.

Figure 9A:
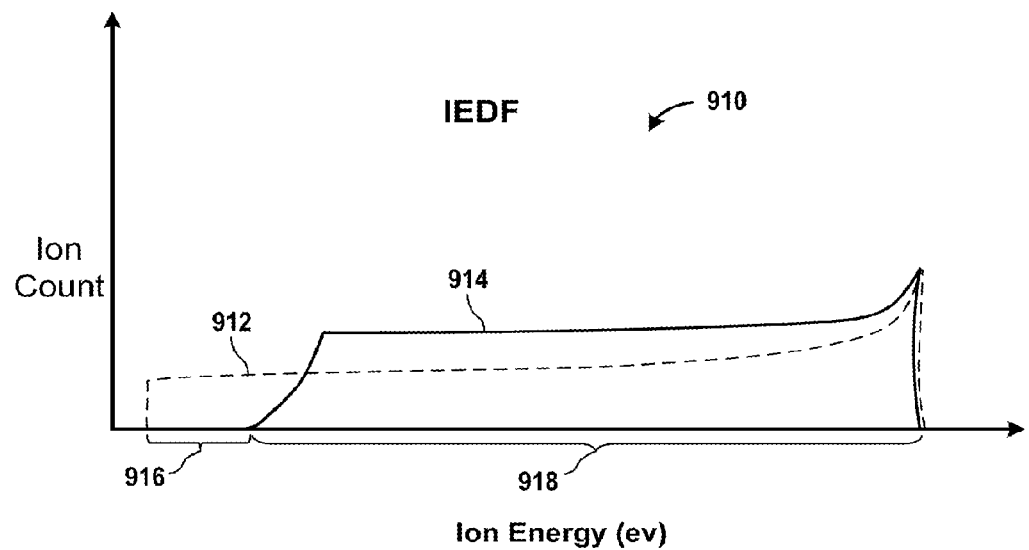
FIG. 9A is a graph to illustrate that use of the kHz RF generator and the low or high frequency MHz RF generator with an impedance matching circuit to provide a modified RF signal to an electrode of a plasma chamber facilitates generation of a lower amount of ion energy than an amount of ion energy generated by using the low frequency MHz RF generator and the high frequency MHz RF generator without using the kHz RF generator, in accordance with an embodiment described in the present disclosure.

FIG. 9A is an embodiment of a graph 910 to illustrate that use of the x1 kHz RF generator and the x or y MHz RF generator with the impedance matching circuit 104 (FIG. 1A) to provide the modified RF signal 114 (FIG. 1A) to an electrode of the plasma chamber 110 (FIG. 1A) facilitates generation of a lower amount of ion energy than an amount of ion energy generated by using the x MHz RF generator and the y MHz RF generator without using the x1 kHz RF generator. The graph 910 plots an ion energy distribution function, which is a function of ion count of ions formed within the plasma chamber 110 versus ion energy of the ions.

As seen in the graph 910, a plot 912 is created when the x1 kHz and the x or y MHz RF generators are used to provide RF signals to the impedance matching circuit 104, which transfers the RF signals to generate the modified RF signal 114, which is sent to the plasma chamber 110 to generate plasma ions within the plasma chamber 110. For example, the plot 912 is created when the circuit 202A (FIG. 2A) transfers an RF signal that is received from the x1 kHz RF generator and the circuit 202B (FIG. 2A) transfers an RF signal that is received from the x MHz RF generator. Moreover, another plot 914 is created when the x MHz RF generator and the y MHz RF generator are used to provide RF signals to an impedance matching circuit, which transfers the RF signal to generate a modified RF signal, and the modified RF signal is provided to the plasma chamber 110 to generate plasma ions within the plasma chamber 110. The x1 kHz RF generator is not used in creating the plot 914. For example, the plot 914 is created when a circuit, e.g., the circuit 202A, 202B, 202C, etc., of an impedance matching circuit (not shown) transfers an RF signal that is received from the x MHz RF generator and another circuit of the impedance matching circuit transfers an RF signal that is received from the y MHz RF generator. As another example, the plot 914 is created when the end E1 of the circuit 202A (FIG. 2A) is connected to the x MHz RF generator and the end E2 of the circuit 202B (FIG. 2A) is connected to the y MHz RF generator, when a lower number of blocking components are used between the ends E1 and 220 (FIG. 2B) than that used in the circuit 202A, and when a lower number of blocking components are used between the ends than that used in the circuit 202B. As shown, the plot 912 spans partially over an area 916 corresponding to ion energy that is lower than an amount of ion energy corresponding to an area 918 spanned by the plot 914.

The lower amount of ion energy associated with the region 916 facilitates higher selectivity while removing, e.g., etching, sputtering, etc., a material, e.g., oxide, monomer, polymer, etc., overlaid on top of the substrate 120 (FIG. 1A).

In one embodiment, a selectivity is defined as a ratio of a rate of etching an etch layer, e.g., an oxide layer laid on top of the substrate, a monomer overlaid on top of the substrate 120, a polymer overlaid on top of the substrate 120, etc., to a rate of etching a mask layer that is overlaid on top of the etch layer.

Figure 9B:
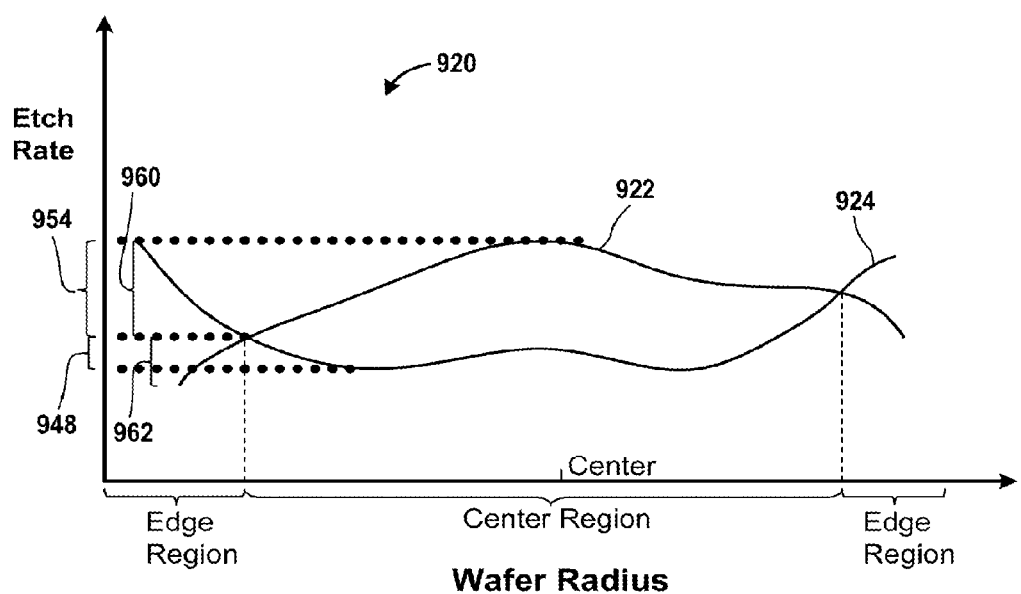
FIG. 9B is a graph used to illustrate a change in an etch profile when the kHz and the low or high frequency MHz RF generator are used compared to using the low or high frequency MHz RF generator without using the kHz RF generator, in accordance with an embodiment described in the present disclosure.

FIG. 9B is an embodiment of a graph 920 used to illustrate a change in an etch profile when the x1 kHz and x or y MHz RF generators are used compared to using the x and y MHz RF generators without using the kHz RF generator. The graph 920 plots an etch rate versus a radius of the substrate 120 (FIG. 1A). The graph 920 includes an etch profile 922 of etch rates when the circuit 202A (FIG. 2A) is connected to the x or y MHz RF generator instead of being connected to the x1 kHz RF generator and the circuit 202B (FIG. 2A) is connected to the y MHz RF generator instead of being connected to the x MHz RF generator. Moreover, the graph 920 includes an etch profile 924 of etch rates when the end E1 (FIG. 2A) of the circuit 202A is connected to the x1 kHz RF generator instead of being connected to the x MHz RF generator and the end E2 (FIG. 2A) of the circuit 202B is connected to the x MHz RF generator instead of being connected to the y MHz RF generator.

From the etch profiles 922 and 924, when the circuit 202A is connected to the x1 kHz RF generator to transfer an RF signal received from the x1 kHz RF generator and the circuit 202B is connected to the x or y MHz RF generator to receive an RF signal that is generated by the x or y MHz RF generator, an etch rate range 948 achieved in the center region of the plasma chamber 110 is lower than an etch rate range 954. The etch rate range 954 is of the plot 922 and the etch rate range 948 is of the plot 924. The etch rate range 954 is achieved in the center region when the end E1 of the circuit 202A is connected to the x MHz RF generator and not to the x1 kHz RF generator and a lower number of blocking components are included between the ends E1 and 220 (FIG. 2A) of the circuit 202A as described herein. Moreover, the etch rate range 954 is achieved in the center region when the end E2 of the circuit 202B is connected to the y MHz RF generator and not to the x MHz RF generator and a lower number of blocking components are included between the ends E2 and 220 of the circuit 202B as described herein.

Moreover, as shown in the etch profiles 922 and 924, when the circuit 202A is connected to the x1 kHz RF generator to transfer an RF signal received from the x1 kHz RF generator and the circuit 202B is connected to the x or y MHz RF generator to receive an RF signal that is generated by the x or y MHz RF generator, an etch rate range 960 achieved at the edge region of the plasma chamber 110 is greater than an etch rate range 962. The etch rate range 962 is achieved at the edge region when the end E1 of the circuit 202A is connected to the x MHz RF generator and not to the x1 kHz RF generator and a lower number of blocking components are included between the ends E1 and 220 (FIG. 2A) of the circuit 202A as described herein. Moreover, the etch rate range 962 is achieved in the edge region when the end E2 of the circuit 202B is connected to the y MHz RF generator and not to the x MHz RF generator and a lower number of blocking components are included between the ends E2 and 220 of the circuit 202B as described herein.

In one aspect, some of the embodiments, described herein, are practiced with various computer system configurations including hand-held hardware units, microprocessor systems, microprocessor-based or programmable consumer electronics, minicomputers, mainframe computers, etc. In an aspect, some of the embodiments, described herein, are practiced in distributed computing environments where tasks are performed by remote processing hardware units that are linked through a computer network.

In various embodiments, a controller is part of a system. The system includes semiconductor processing equipment, including a processing tool or tools, chamber or chambers, a platform or platforms for processing, and/or specific processing components (a wafer pedestal, a gas flow system, etc.). The system is integrated with electronics for controlling its operation before, during, and after processing of a semiconductor wafer or substrate. The electronics is referred to as the "controller," which controls various components or subparts of the system. The controller, depending on processing requirements and/or a type of the system, is programmed to control any process disclosed herein, using a recipe, which includes a process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks connected to or interfaced with the system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, DSPs, chips defined as ASICs, PLDs, one or more microprocessors, or microcontrollers that execute program instructions (e.g., software). The program instructions are instructions communicated to the controller in the form of various individual settings (or program files), defining operational parameters for carrying out a process on or for a semiconductor wafer. The operational parameters are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with the system, or coupled to the system, or otherwise networked to the system, or a combination thereof. For example, the controller is in a "cloud" or all or a part of a fab host computer system, which allows for remote access for wafer processing. The controller enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to the system over a computer network, which includes a local network or the Internet. The remote computer includes a user interface that enables entry or programming of parameters and/or settings, which are then communicated to the system from the remote computer. In various embodiments, the controller receives instructions in the form of settings for processing a wafer. It should be understood that the settings are specific to a type of process to be performed on a wafer and a type of tool that the controller interfaces with or controls. Thus as described above, the controller is distributed, such as by including one or more discrete controllers that are networked together and working towards a common purpose, such as the fulfilling processes described herein. An example of a distributed controller for such purposes includes one or more integrated circuits on a chamber in communication with one or more integrated circuits located remotely (such as at a platform level or as part of a remote computer) that combine to control a process in a chamber.

Without limitation, in various embodiments, the system includes a plasma etch chamber, a deposition chamber, a spin-rinse chamber, a metal plating chamber, a clean chamber, a bevel edge etch chamber, a physical vapor deposition (PVD) chamber, a chemical vapor deposition (CVD) chamber, an atomic layer deposition (ALD) chamber, an atomic layer etch (ALE) chamber, an ion implantation chamber, a track chamber, and/or any other semiconductor processing chamber that is associated or used in fabrication and/or manufacturing of semiconductor wafers.

It is further noted that although the above-described operations are described with reference to a parallel plate plasma chamber, e.g., a capacitively coupled plasma chamber, etc., in some embodiments, the above-described operations apply to other types of plasma chambers, e.g., a plasma chamber including an inductively coupled plasma (ICP) reactor, a transformer coupled plasma (TCP) reactor, conductor tools, dielectric tools, a plasma chamber including an electron cyclotron resonance (ECR) reactor, etc. For example, an x MHz RF generator, a y MHz RF generator, and a z MHz RF generator are coupled to the ESC within the ICP plasma chamber.

As noted above, depending on a process operation to be performed by the tool, the controller communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These computer-implemented operations are those that manipulate physical quantities.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations, described herein, are performed by a computer selectively activated, or are configured by one or more computer programs stored in a computer memory, or are obtained over a computer network. When data is obtained over the computer network, the data may be processed by other computers on the computer network, e.g., a cloud of computing resources.

One or more embodiments, described herein, can also be fabricated as computer-readable code on a non-transitory computer-readable medium. The non-transitory computer-readable medium is any data storage hardware unit, e.g., a memory device, etc., that stores data, which is thereafter read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although some method operations, described above, were presented in a specific order, it should be understood that in various embodiments, other housekeeping operations are performed in between the method operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein, but may be modified within the scope and equivalents of the appended claims.

The invention claimed is:

1. An impedance matching circuit, comprising:
   a first circuit including a first plurality of series circuits and a first plurality of shunt circuits, the first circuit having an input coupled to a kilohertz (kHz) radio frequency (RF) generator;
   a second circuit having a second plurality of series circuits and a second plurality of shunt circuits, the second circuit having an input coupled to a low frequency megahertz (MHz) RF generator, the second circuit being adjacent to the first circuit;
   a third circuit having one or more series circuits and one or more shunt circuits, the third circuit having an input coupled to a high frequency MHz RF generator, the third circuit being adjacent to the second circuit;
   an output of the first, second, and third circuits coupled to an input of an RF transmission line that is coupled to a plasma chamber,
   wherein the first circuit and the second circuit provide isolation between a kHz RF signal and a low frequency MHz RF signal, wherein the isolation between the kHz RF signal and the low frequency MHz RF signal is provided by an increased number of tuning elements of the first circuit compared to a number of tuning elements of the third circuit,
   wherein the kHz RF signal is reflected from the plasma chamber via the RF transmission line and the first circuit towards the kHz RF generator, wherein the low frequency MHz RF signal is reflected from the plasma chamber via the RF transmission line and the second circuit towards the low frequency MHz RF generator.

2. The impedance matching circuit of claim 1,
   wherein the isolation between the kHz RF signal and the low frequency MHz RF signal is provided by an increased number of tuning elements of the second circuit compared to the number of tuning elements of the third circuit.

3. The impedance matching circuit of claim 1, wherein each tuning element includes an inductor or a capacitor.

4. The impedance matching circuit of claim 1, wherein the kHz RF generator has frequencies ranging between 20 kHz and 1 MHz, wherein the low frequency MHz RF generator has frequencies ranging between 1 MHz and 4 MHz, and the high frequency MHz RF generator has frequencies ranging between 13 MHz and 200 MHz.

5. The impedance matching circuit of claim 1, wherein the plasma chamber includes an upper electrode, the upper electrode including a semiconductor layer, a gas distribution plate laid on top of the semiconductor layer, a heater laid on top of the gas distribution plate, a thermal choke laid on top of the heater, and a top plate laid on top of the thermal choke, wherein the upper electrode excludes an insulator layer.

6. The impedance matching circuit of claim 1,
   wherein the first circuit is configured to send a first RF signal having a maximum power level and the second circuit is configured to send a second RF signal having a minimum power level to achieve a first positive potential level at the RF transmission line and to achieve a first negative potential level at the RF transmission line, wherein the first RF signal is a kHz signal and the second RF signal is a low frequency MHz signal, wherein the first circuit is configured to send the first RF signal having a minimum power level and the second circuit is configured to send the second RF signal having a maximum power level to achieve a second positive potential level at the RF transmission line and to achieve a second negative potential level at the RF transmission line, wherein the first circuit is configured to send the first RF signal having a level between the minimum and maximum power levels and the second circuit is configured to send the second RF signal having a level between the minimum and maximum power levels to achieve a third positive potential level at the RF transmission line and to achieve a third negative potential level at the RF transmission line, the third positive potential level being greater than each of the first and second positive potential levels, the third negative potential level being less than each of the first and second negative potential levels.

7. The impedance matching circuit of claim 1, wherein the number of tuning elements of the first circuit is greater than a number of tuning elements of an impedance matching circuit that is coupled to the low frequency MHz RF generator and that is not coupled to the kHz RF generator.

8. The impedance matching circuit of claim 1, wherein a number of tuning elements of the second circuit is greater than a number of tuning elements of a circuit of an impedance matching circuit that is coupled to the high frequency MHz RF generator and that is not coupled to the low frequency MHz RF generator.

9. A plasma processing system comprising:
a kilohertz (kHz) radio frequency (RF) signal generator for generating a first RF signal;
a low frequency megahertz (MHz) RF generator for generating a second RF signal;
a high frequency MHz RF generator for generating a third RF signal;
an RF transmission line having an input;
an impedance matching circuit coupled to the kHz RF generator, the low frequency MHz RF generator, and the high frequency MHz RF generator for receiving the first, second, and third RF signals to generate a modified RF signal, wherein the impedance matching circuit includes,
a first circuit including a first plurality of series circuits and a first plurality of shunt circuits, the first circuit having an input coupled to the kHz radio frequency RF generator;
a second circuit having a second plurality of series circuits and a second plurality of shunt circuits, the second circuit having an input coupled to the low frequency MHz RF generator, the second circuit being adjacent to the first circuit;
a third circuit having one or more series circuits and one or more shunt circuits, the third circuit having an input coupled to the high frequency MHz RF generator, the third circuit being adjacent to the second circuit;
an output of the first, second, and third circuits coupled to the input of the RF transmission line,
wherein the first circuit and the second circuit provide isolation between a kHz RF signal and a low frequency MHz RF signal, wherein the isolation between the kHz RF signal and the low frequency MHz RF signal is provided by an increased number of tuning elements of the first circuit compared to a number of tuning elements of the third circuit, wherein the kHz RF signal is reflected from the plasma chamber via the RF transmission line and the first circuit towards the kHz RF generator, wherein the low frequency MHz RF signal is reflected from the plasma chamber via the RF transmission line and the second circuit towards the low frequency MHz RF generator; and a plasma chamber coupled to the RF transmission line, wherein the plasma chamber has an electrode for receiving the modified RF signal to generate plasma within the plasma chamber.

10. The plasma processing system of claim 9, wherein the isolation between the kHz RF signal and the low frequency MHz RF signal is provided by an increased number of tuning elements of the second circuit compared to the number of tuning elements of the third circuit.

11. The plasma processing system of claim 9, wherein each tuning element includes an inductor or a capacitor.

12. The plasma processing system of claim 9, wherein the kHz RF generator has frequencies ranging between 20 kHz and 1 MHz, wherein the low frequency MHz RF generator has frequencies ranging between 1 MHz and 4 MHz, and the high-frequency RF generator has frequencies ranging between 13 MHz and 200 MHz.

13. The plasma processing system of claim 9, wherein the plasma chamber includes an upper electrode, the upper electrode including a semiconductor layer, a gas distribution plate laid on top of the semiconductor layer, a heater laid on top of the gas distribution plate, a thermal choke laid on top of the heater, and a top plate laid on top of the thermal choke, wherein the upper electrode excludes an insulator layer.

14. The plasma processing system of claim 9,
wherein the first circuit is configured to send the first RF signal having a maximum power level and the second circuit is configured to transfer the second RF signal having a minimum power level to achieve a first positive potential level at the RF transmission line and to achieve a first negative potential level at the RF transmission line, wherein the first circuit is configured to send the first RF signal having a minimum power level and the second circuit is configured to send the second RF signal having a maximum power level to achieve a second positive potential level at the RF transmission line and to achieve a second negative potential level at the RF transmission line, wherein the first circuit is configured to send the first RF signal having a level between the minimum and maximum power levels and the second circuit is configured to send the second RF signal having a level between the minimum and maximum power levels to achieve a third positive potential level at the RF transmission line and to achieve a third negative potential level at the RF transmission line, the third positive potential level being greater than each of the first and second positive potential levels, the third negative potential level being less than each of the first and second negative potential levels.

15. The plasma processing system of claim 9, wherein the number of tuning elements of the first circuit is greater than a number of tuning elements of a circuit of an impedance matching circuit that is coupled to the low frequency MHz RF generator and that is not coupled to the kHz RF generator.

16. The plasma processing system of claim 9, wherein a number of tuning elements of the second circuit is greater than a number of tuning elements of a circuit of an impedance matching circuit that is coupled to the high frequency MHz RF generator and that is not coupled to the low frequency MHz RF generator.

17. A plasma processing system comprising:
a kilohertz (kHz) radio frequency (RF) signal generator for generating a first RF signal;
a low frequency megahertz (MHz) RF generator for generating a second RF signal;
a high frequency MHz RF generator for generating a third RF signal;
a host computer coupled to each of the kHz RF generator, the low frequency MHz generator, and the high frequency generator;
an RF transmission line having an input; and
an impedance matching circuit coupled to the kHz RF generator, the low frequency MHz RF generator, and the high frequency MHz RF generator for receiving the first, second, and third RF signals to generate a modified RF signal, wherein the impedance matching circuit includes,
a first circuit including a first plurality of series circuits and a first plurality of shunt circuits, the first circuit having an input coupled to the kHz RF generator;
a second circuit having a second plurality of series circuits and a second plurality of shunt circuits, the second circuit having an input coupled to the low frequency MHz RF generator, the second circuit being adjacent to the first circuit;
a third circuit having one or more series circuits and one or more shunt circuits, the third circuit having an input coupled to the high frequency MHz RF generator, the third circuit being adjacent to the second circuit;
an output of the first, second, and third circuits coupled to the input of the RF transmission line,
wherein the first circuit and the second circuit provide isolation between a kHz RF signal and a low frequency MHz RF signal, wherein the isolation between the kHz RF signal and the low frequency MHz RF signal is provided by an increased number of tuning elements of the first circuit compared to a number of tuning elements of the third circuit,
wherein the kHz RF signal is reflected from the plasma chamber via the RF transmission line and the first circuit towards the kHz RF generator, wherein the low frequency MHz RF signal is reflected from the plasma chamber via the RF transmission line and the second circuit towards the low frequency MHz RF generator.

18. The plasma processing system of claim 17, wherein the isolation between the kHz RF signal and the low frequency MHz RF signal is provided by an increased number of tuning elements of the second circuit compared to the number of tuning elements of the third circuit.

* * * * *